US012751146B2

(12) United States Patent
Park et al.

(10) Patent No.: US 12,751,146 B2
(45) Date of Patent: Sep. 29, 2026

(54) DISPLAY DEVICE AND METHOD FOR FABRICATING THE SAME

(71) Applicant: Samsung Display Co., LTD., Yongin-si (KR)

(72) Inventors: Joon Yong Park, Yongin-si (KR); Hyun Eok Shin, Yongin-si (KR); Dong Min Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 413 days.

(21) Appl. No.: 18/218,315

(22) Filed: Jul. 5, 2023

(65) Prior Publication Data

US 2024/0114726 A1 Apr. 4, 2024

(30) Foreign Application Priority Data

Oct. 4, 2022 (KR) ........................ 10-2022-0126142

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/38* (2023.02);
(Continued)

(58) Field of Classification Search
CPC .................................................... H10K 59/122
See application file for complete search history.

(56) References Cited

U.S. PATENT DOCUMENTS 11,342,404 B2 5/2022 Ko et al.
11,348,983 B1 * 5/2022 Choung ........... H10K 59/80522
(Continued)

FOREIGN PATENT DOCUMENTS

CN 112234080 A 1/2021
CN 113471384 A 10/2021
(Continued)

OTHER PUBLICATIONS

Extended European Search Report—European Application No. 23199095.3 dated Feb. 12, 2024, citing references listed within.

*Primary Examiner* — Mariceli Santiago
(74) *Attorney, Agent, or Firm* — CANTOR COLBURN LLP

(57) ABSTRACT

A display device includes first and second pixel electrodes on a substrate and spaced apart from each other, an inorganic insulating layer on the substrate and including portions on the first and second pixel electrodes, a bank structure on the inorganic insulating layer with first and second openings overlapping the first and second pixel electrodes, first and second light emitting layers on the first and second pixel electrodes, and first and second common electrodes on the first and second light emitting layers. The bank structure includes a first bank layer, a second bank layer on the first bank layer and including a different metal material from the first bank layer, and a third bank layer on the second bank layer and including an oxide semiconductor layer, and each of the second bank layer and the third bank layer includes a tip on sidewalls defining the first and second openings.

15 Claims, 15 Drawing Sheets

CF: CF1, CF2, CF3
TFEL: TFE1, TFE2, TFE3
TFE1: TL1, TL2, TL3

(51) Int. Cl.
*H10K 59/38* (2023.01)
*H10K 59/80* (2023.01)
*H10K 71/20* (2023.01)

(52) U.S. Cl.
CPC ....... *H10K 59/873* (2023.02); *H10K 59/8792* (2023.02); *H10K 71/233* (2023.02)

(56) References Cited

U.S. PATENT DOCUMENTS

| | | | | |
|---|---|---|---|---|
| 11,889,730 | B2 | 1/2024 | Ko et al. | |
| 12,610,694 | B2 | 4/2026 | Tabatake | |
| 2008/0231168 | A1* | 9/2008 | Choi .................... | H10K 59/122<br>313/500 |
| 2010/0133993 | A1* | 6/2010 | Pang .................... | H10K 59/126<br>445/24 |
| 2012/0217516 | A1* | 8/2012 | Hatano ................ | H10K 59/122<br>257/E33.062 |
| 2013/0288413 | A1* | 10/2013 | Choi .................... | H10K 59/122<br>438/34 |
| 2022/0077252 | A1 | 3/2022 | Choung et al. | |
| 2022/0093894 | A1 | 3/2022 | Song et al. | |
| 2022/0102448 | A1 | 3/2022 | Liu et al. | |
| 2023/0284509 | A1* | 9/2023 | Suzumura ............ | H10K 71/231<br>257/40 |
| 2024/0090272 | A1* | 3/2024 | Tabatake .............. | H10K 59/873 |

FOREIGN PATENT DOCUMENTS

| | | | |
|---|---|---|---|
| JP | 2008135325 | A | 6/2008 |
| KR | 20180075756 | A | 7/2018 |
| KR | 20210022206 | A | 3/2021 |
| KR | 20230153284 | A | 11/2023 |

* cited by examiner

DISPLAY DEVICE AND METHOD FOR FABRICATING THE SAME

This application claims priority to Korean Patent Application No. 10-2022-0126142, filed on Oct. 4, 2022, and all the benefits accruing therefrom under 35 U.S.C. § 119, the content of which in its entirety is herein incorporated by reference.

BACKGROUND

1. Field

The disclosure relates to a display device and a method for fabricating the same.

2. Description of the Related Art

With the advancement of the information technology, the demand for a display device for displaying an image has increased in various fields. For example, the display device has been applied to various electronic devices such as a smart phone, a digital camera, a laptop computer, a navigator and a smart television. The display device may be a flat panel display device such as a liquid crystal display device, a field emission display device and an organic light emitting display device. Among the flat panel display devices, the light emitting display device includes a light emitting element in which each of pixels of a display panel may self-emit light, thereby displaying an image without using a backlight unit that provides the display panel with light.

SUMMARY

Embodiments of the disclosure provide a display device capable of forming light emitting elements isolated for each light emission area without a mask process.

Embodiments of the disclosure provide a display device that reduces a light emitting deviation that may occur in each pixel due to damage to a bank structure by an etching process performed during a fabricating process of the display device.

According to an embodiment of the disclosure, a display device includes a first pixel electrode and a second pixel electrode disposed on a substrate and spaced apart from each other, an inorganic insulating layer disposed on the substrate and including a portion disposed on the first pixel electrode and a portion disposed on the second pixel electrode, a bank structure disposed on the inorganic insulating layer, where a first opening overlapping the first pixel electrode and a second opening overlapping the second pixel electrode are defined through the bank structure, a first light emitting layer disposed on the first pixel electrode and a second light emitting layer disposed on the second pixel electrode, and a first common electrode disposed on the first light emitting layer and a second common electrode disposed on the second light emitting layer, where the bank structure includes a first bank layer, a second bank layer disposed on the first bank layer and including a metal material different from that of the first bank layer, and a third bank layer disposed on the second bank layer and including at least one oxide semiconductor layer, and each of the second bank layer and the third bank layer includes a tip defined on each of sidewalls of the bank structure defining the first opening and the second opening and protruding further than the first bank layer.

In an embodiment, the first bank layer may include aluminum (Al), the second bank layer may include titanium (Ti), and the third bank layer may include at least one selected from indium zinc oxide (IZO), indium gallium zinc oxide (IGZO), indium tin gallium zinc oxide (ITGZO), indium tin oxide (ITO), indium tin zinc oxide (ITZO), indium tin gallium oxide (ITGO) and indium gallium oxide (IGO).

In an embodiment, the third bank layer may include a first oxide semiconductor layer, and a second oxide semiconductor layer disposed on the first oxide semiconductor layer and including an oxide semiconductor different from an oxide semiconductor of the first oxide semiconductor layer.

In an embodiment, the third bank layer may have a thickness in a range of about 100 angstroms (Å) to 1500 (Å).

In an embodiment, a tip defined on a sidewall of the bank structure defining the first opening may have a thickness the same as a thickness of a tip defined on a sidewall of the bank structure defining the second opening.

In an embodiment, each of the first common electrode and the second common electrode may be directly in contact with a side surface of the first bank layer.

In an embodiment, the display device may further include a first organic pattern disposed on the third bank layer to surround the first opening and including a same material as a material of the first light emitting layer, a first electrode pattern disposed on the first organic pattern and including a same material as a material of the first common electrode, a second organic pattern disposed on the third bank layer to surround the second opening and including a same material as a material of the second light emitting layer; and a second electrode pattern disposed on the second organic pattern and including a same material as a material of the second common electrode.

In an embodiment, the display device may further include a first inorganic layer disposed on a sidewall of the bank structure defining the first opening and disposed on the first common electrode and the first electrode pattern, and a second inorganic layer disposed on a sidewall of the bank structure defining the second opening and disposed on the second common electrode and the second electrode pattern, where the first inorganic layer and the second inorganic layer may be disposed to be spaced apart from each other, and the third bank layer may include a portion not overlapping the first inorganic layer and the second inorganic layer.

In an embodiment, the inorganic insulating layer may be not in contact with each of upper surfaces of the first pixel electrode and the second pixel electrode, the first light emitting layer may include a portion disposed between the first pixel electrode and the inorganic insulating layer, and the second light emitting layer may include a portion disposed between the second pixel electrode and the inorganic insulating layer.

In an embodiment, the display device may further include a residual pattern disposed between the first and second pixel electrodes and the inorganic insulating layer.

In an embodiment, the display device may further include a third pixel electrode disposed to be spaced apart from the second pixel electrode on the substrate, a third light emitting layer disposed on the third pixel electrode, and a third common electrode disposed on the third light emitting layer, where a third opening overlapping the third pixel electrode is defined through the bank structure.

In an embodiment, the display device may further include a third organic pattern disposed on the third bank layer to surround the third opening and including a same material as a material of the third light emitting layer, a third electrode pattern disposed on the third organic pattern and including a same material as a material of the third common electrode, and a third inorganic layer disposed on a sidewall of the bank structure defining the third opening and disposed on the third common electrode and the third electrode pattern.

In an embodiment, the display device may further include a thin film encapsulation layer disposed on the bank structure, where the thin film encapsulation layer may include a first encapsulation layer, a second encapsulation layer disposed on the first encapsulation layer, and a third encapsulation layer disposed on the second encapsulation layer.

In an embodiment, the display device may further include a light shielding layer disposed on the third encapsulation layer, where a plurality of opening holes is defined through the light shielding layer to overlap the first opening and the second opening, a first color filter disposed on the light shielding layer and overlapping the first opening, and a second color filter overlapping the second opening.

According to an embodiment of the disclosure, a method for fabricating a display device includes forming a plurality of pixel electrodes spaced apart from each other on a substrate, forming a sacrificial layer on the pixel electrodes, forming an inorganic insulating layer on the sacrificial layer and forming first to third bank material layers on the inorganic insulating layer, forming a first hole overlapping the pixel electrode and exposing the sacrificial layer disposed on a pixel electrode of the pixel electrodes through the first bank material layer, the second bank material layer and the third bank material layer, removing the sacrificial layer through a wet etching of the sacrificial layer and a sidewall defining the first hole, wherein tips of the second bank material layer and the third bank material layer, which are further protruded than a sidewall of the first bank material layer, is formed by the wet etching, forming a light emitting layer and a common electrode on the pixel electrode in a first opening formed by the wet etching and forming an inorganic layer on the common electrode and the third bank material layer, and removing a portion of the inorganic layer disposed on the third bank material layer.

In an embodiment, the first bank material layer may include aluminum (Al), the second bank material layer may include titanium (Ti), and the third bank material layer may include at least one selected from IZO, IGZO, ITGZO, ITO, ITZO, ITGO and IGO.

In an embodiment, the inorganic layer may include at least one selected from silicon oxide, silicon nitride and silicon oxynitride, and the etching of the inorganic layer may be performed by a dry etching process using a fluorine (F)-based etchant.

In an embodiment, the method may further include after removing the portion of the inorganic layer, forming a second hole overlapping another pixel electrode of the pixel electrodes through the first bank material layer, the second bank material layer and the third bank material layer, and forming a second opening by a wet etching of a sidewall defining the second hole, where a tip formed in the first opening and a tip formed in the second opening may have a same thickness as each other.

In an embodiment, the common electrode may be directly in contact with a side surface of the first bank material layer.

In an embodiment, the forming the light emitting layer and the common electrode may include forming an organic pattern including a same material as a material of the light emitting layer on the third bank material, and forming an electrode pattern including a same material as a material of the common electrode on the organic pattern, where the inorganic layer may be formed on the electrode pattern.

The display device according to an embodiment may have a structure in which a bank structure that forms a light emission area is prevented from being damaged during a fabricating process of the display device. Therefore, the display device may prevent tips formed in openings of the bank structure from being sagged, and uniform luminance may be maintained for each light emitting element so that a spot may be prevented from occurring in the display device.

BRIEF DESCRIPTION OF THE DRAWINGS

The above and other features of embodiments of the disclosure will become more apparent by describing in detail embodiments thereof with reference to the accompanying drawings, in which.

DETAILED DESCRIPTION

Figure 1:
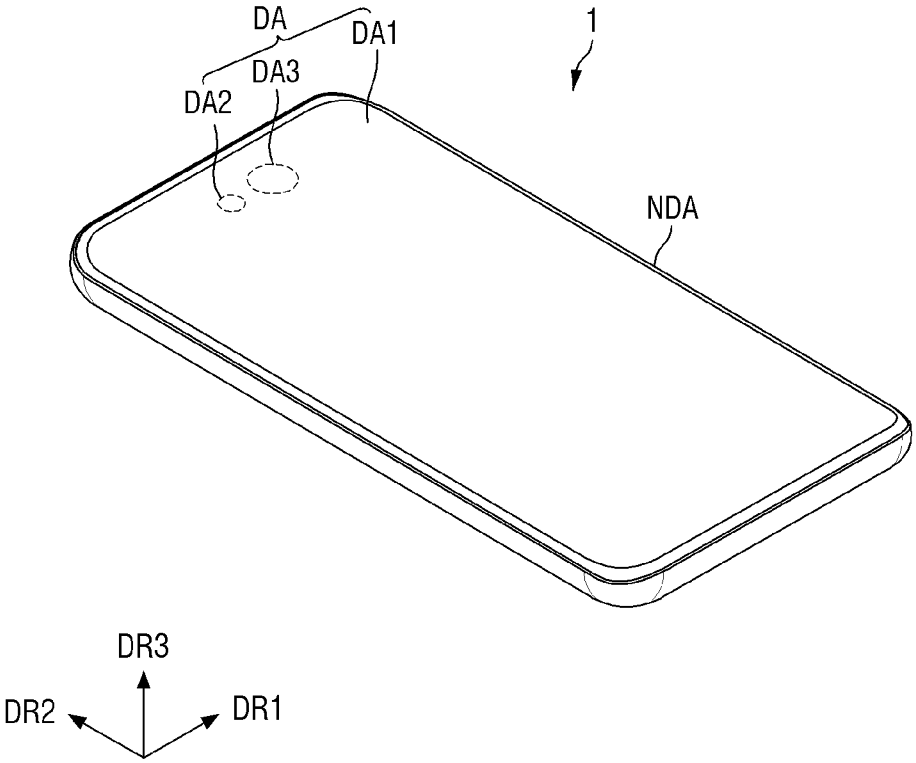
FIG. 1 is a schematic perspective view illustrating an electronic device according to an embodiment.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings.

FIG. 1 is a schematic perspective view illustrating an electronic device according to an embodiment.

Referring to FIG. 1, an embodiment of an electronic device 1 displays a moving image or a still image. The electronic device 1 may refer to all electronic devices that provide a display screen, for example, a television, a laptop computer, a monitor, an advertising board, Internet of Things, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder or the like.

The electronic device 1 may include a display device 10 (shown in FIG. 2) for providing a display screen. In an embodiment, the display device may be an inorganic light emitting diode display device, an organic light emitting display device, a quantum dot light emitting display device, a plasma display device or a field emission display device. Hereinafter, for convenience of description, embodiments where the display device is an organic light emitting diode display device will be described in detail, but the embodiment of the display device is not limited to the organic light emitting diode display device, and another type of display device may be applied without departing from the teachings herein.

Various modifications may be made in a shape of the electronic device 1. In an embodiment, for example, the electronic device 1 may have a rectangular shape that is long in a horizontal direction, a rectangular shape that is long in a vertical direction, a square shape, a square shape with rounded corners (vertexes), other polygonal shape, a circular shape, etc. A shape of a display area DA of the electronic device 1 may be also similar to the overall shape of the electronic device 1. In an embodiment, an electronic device 1 may have a rectangular shape that is longer in a second direction DR2 as illustrated in FIG. 1.

The electronic device 1 may include a display area DA and a non-display area NDA. The display area DA is an area in which an image may be displayed, and the non-display area NDA is an area in which no image is displayed. The display area DA may be referred to as an active area, and the non-display area NDA may be referred to as a non-active area. The display area DPA may generally occupy the center of the electronic device 1.

The display area DA may include a first display area DA1, a second display area DA2, and a third display area DA3. The second display area DA2 and the third display area DA3 are areas in which components for adding various functions to the electronic device 1 are disposed, and may correspond to component areas.

Figure 2:
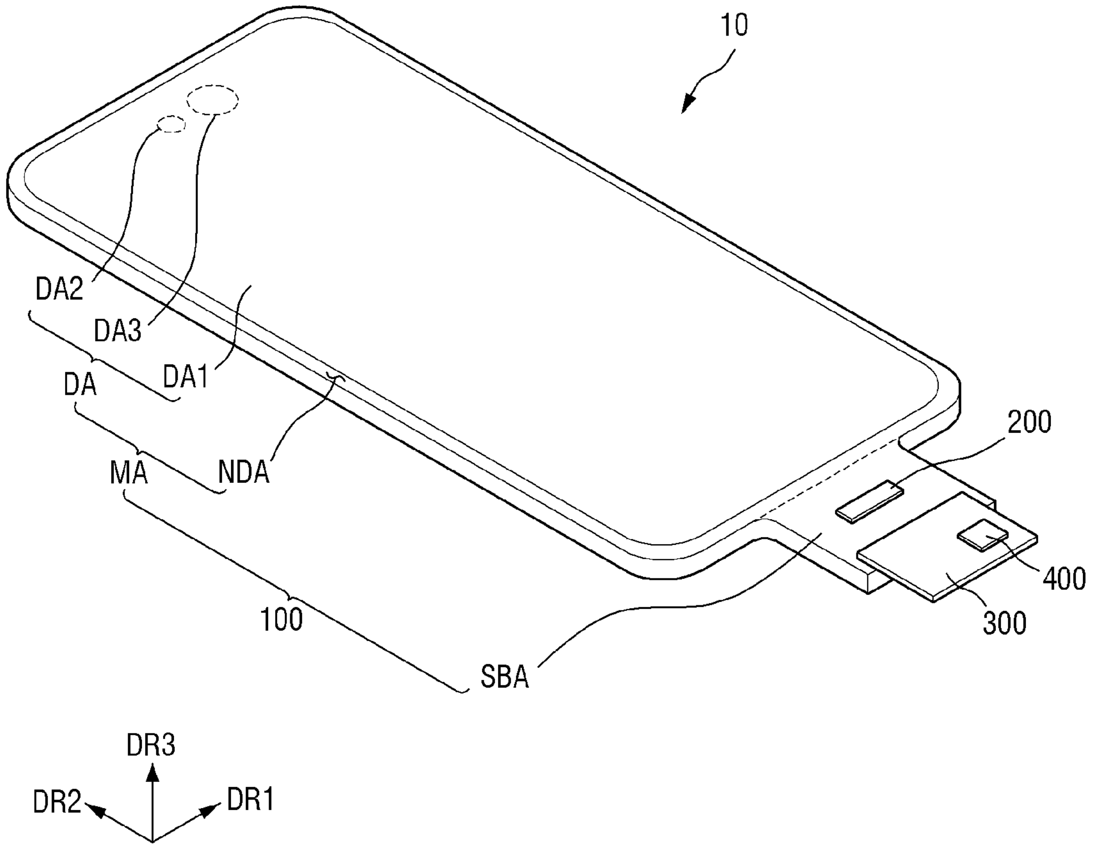
FIG. 2 is a perspective view illustrating a display device included in an electronic device according to an embodiment.

FIG. 2 is a perspective view illustrating a display device included in an electronic device according to an embodiment.

Referring to FIG. 2, the electronic device 1 according to an embodiment may include a display device 10. The display device 10 may provide a screen for the electronic device 1. The display device 10 may have a planar shape similar to that of the electronic device 1. In an embodiment, for example, the display device 10 may have a shape similar to a rectangular shape having a short side in a first direction DR1 and a long side in a second direction DR2. A corner at which the short side in the first direction DR1 and the long side in the second direction DR2 meet may be rounded to have a curvature, but is not limited thereto, and may be formed at a right angle. The planar shape of the display device 10 is not limited to a quadrangle and may be formed to be similar to another polygonal shape, a circular shape or an elliptical shape.

The display device 10 may include a display panel 100, a display driver 200, a circuit board 300 and a touch driver 400.

The display panel 100 may include a main area MA and a sub-area SBA.

The main area MA may include a display area DA including pixels for displaying an image, and a non-display area NDA disposed near the display area DA. The display area DA may include a first display area DAT, a second display area DA2 and a third display area DA3. The display area DA may emit light from a plurality of light emission areas or a plurality of opening areas. In an embodiment, for example, the display panel 100 may include a pixel circuit including switching elements, a pixel defining layer defining a light emission area or an opening area, and a self-light emitting element.

In an embodiment, for example, the self-light emitting element may include at least one selected from an organic light emitting diode (LED) including an organic light emitting layer, a quantum dot LED including a quantum dot light emitting layer, an inorganic LED including an inorganic semiconductor and a micro LED.

The non-display area NDA may be an outer area of the display area DA. The non-display area NDA may be defined as an edge area of the main area MA of the display panel 100. The non-display area NDA may include a gate driver (not shown) for supplying gate signals to gate lines and fan-out lines (not shown) connecting the display driver 200 with the display area DA.

The sub-area SBA may be an area extended from one side of the main area MA. The sub-area SBA may include a flexible material capable of being subjected to bending, folding, rolling or the like. In an embodiment, for example, when the sub-area SBA is bent, the sub-area SBA may overlap the main area MA in a thickness direction (a third direction DR3). The sub-area SBA may include a display driver 200 and a pad portion connected to the circuit board 300. In an alternative embodiment, the sub-area SBA may be omitted, and the display driver 200 and the pad portion may be disposed in the non-display area NDA.

The display driver 200 may output signals and voltages for driving the display panel 100. The display driver 200 may supply data voltages to data lines. The display driver 200 supplies a power voltage to a power line and supplies a gate control signal to the gate driver. The display driver 200 may be formed of or defined by an integrated circuit (IC) and then packaged on the display panel 100 by a chip-on-glass (COG) method, a chip-on-plastic (COP) method or an ultrasonic bonding method. In an embodiment, for example, the display driver 200 may be disposed in the sub-area SBA, and may overlap the main area MA in the thickness direction by bending of the sub-area SBA. In an alternative embodiment, for example, the display driver 200 may be packaged on the circuit board 300.

The circuit board 300 may be attached to the pad portion of the display panel 100 by an anisotropic conductive film (ACF). Lead lines of the circuit board 300 may be electrically connected to the pad portion of the display panel 100. The circuit board 300 may be a flexible film such as a flexible printed circuit board, a printed circuit board or a chip on film.

The touch driver 400 may be mounted or packaged on the circuit board 300. The touch driver 400 may be connected to a touch sensor of the display panel 100. The touch driver 400 may supply a touch driving signal to a plurality of touch electrodes of the touch sensor and sense a change amount of capacitance between the plurality of touch electrodes. In an embodiment, for example, the touch driving signal may be a pulse signal having a predetermined frequency. The touch driver 400 may calculate whether input is performed and input coordinates based on the change amount in capacitance between the plurality of touch electrodes. The touch driver 400 may be formed as an IC.

Figure 3:
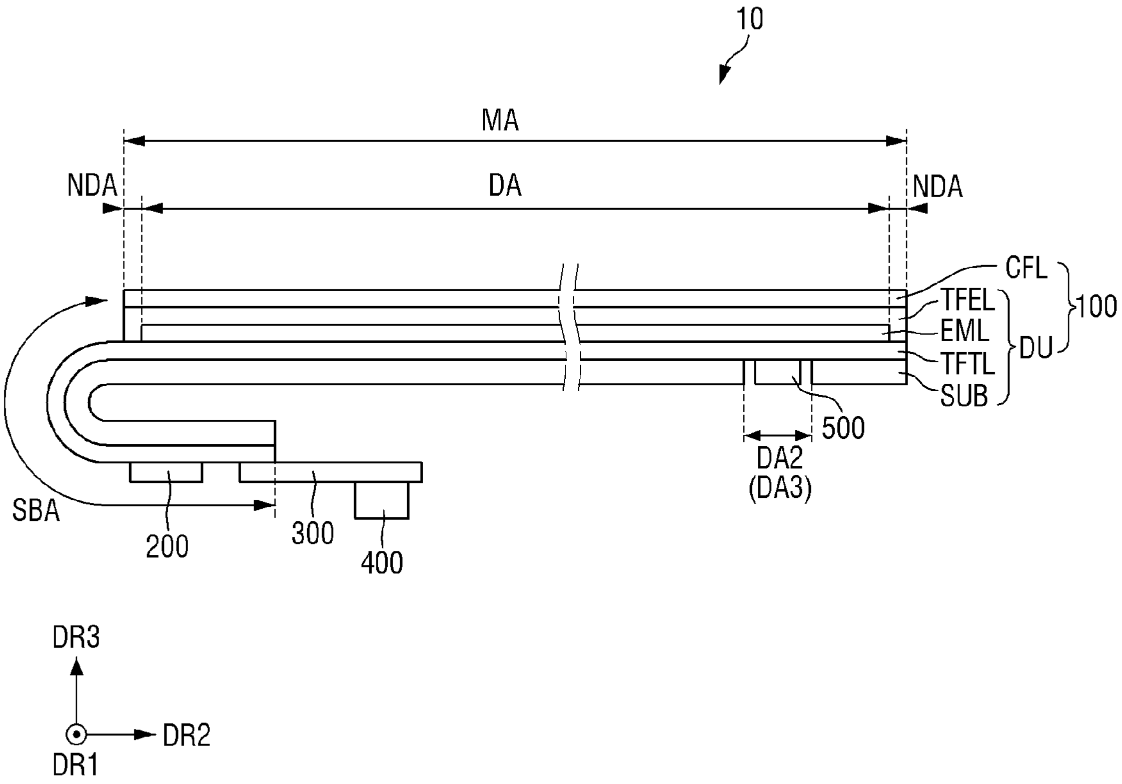
FIG. 3 is a cross-sectional view of the display device of FIG. 2.

FIG. 3 is a cross-sectional view of the display device of FIG. 2.

Referring to FIG. 3, an embodiment of the display panel 100 may include a display layer DU and a color filter layer CFL. The display layer DU may include a substrate SUB, a thin film transistor layer TFTL, a light emitting element layer EML, and a thin film encapsulation layer TFEL.

The substrate SUB may be a base substrate or a base member. The substrate SUB may be a flexible substrate capable of being subjected to bending, folding, rolling or the like. In an embodiment, for example, the substrate SUB may include a polymer resin such as polyimide (PI), but is not limited thereto. In an alternative embodiment, the substrate SUB may include a glass material or a metal material.

The thin film transistor layer TFTL may be disposed on the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines for connecting the display driver 200 with the data lines, and lead lines for connecting the display driver 200 with the pad portion. Each of the thin film transistors may include a semiconductor area, a source area, a drain electrode, and a gate electrode. In an embodiment, for example, where the gate driver is disposed or formed on one side portion of the non-display area NDA of the display panel 100, the gate driver may include thin film transistors.

The thin film transistor layer TFTL may be disposed in the display area DA, the non-display area NDA, and the sub-area SBA. The thin film transistors, the gate lines, the data lines and the power lines of respective pixels of the thin film transistor layer TFTL may be disposed in the display area DA. The gate control lines and fan-out lines of the thin film transistor layer TFTL may be disposed in the non-display area NDA. The lead lines of the thin film transistor layer TFTL may be disposed in the sub-area SBA.

The light emitting element layer EML may be disposed on the thin film transistor layer TFTL. The light emitting element layer EML may include a plurality of light emitting elements that include a first electrode, a second electrode and a light emitting layer to emit light, and a pixel defining layer that defines pixels. The plurality of light emitting elements of the light emitting element layer EML may be disposed in the display area DA.

In an embodiment, the light emitting layer may be an organic light emitting layer that includes an organic material. In such an embodiment, the light emitting layer may include a hole transporting layer, an organic light emitting layer, and an electron transporting layer. When the first electrode receives a voltage through the thin film transistor of the thin film transistor layer TFTL and the second electrode receives a cathode voltage, holes and electrons may move to the organic light emitting layer through the hole transporting layer and the electron transporting layer, respectively, and may be combined with each other in the organic light emitting layer to emit light.

In an alternative embodiment, the light emitting element may include a quantum dot LED including a quantum dot light emitting layer, an inorganic LED including an inorganic semiconductor, or a micro LED.

The thin film encapsulation layer TFEL may cover an upper surface and sides of the light emitting element layer EML and protect the light emitting element layer EML. The thin film encapsulation layer TFEL may include at least one inorganic layer and at least one organic layer to encapsulate the light emitting element layer EML.

Although not shown, in an alternative embodiment, a touch layer may be further disposed on the thin film encapsulation layer TFEL. The touch layer may include a plurality of touch electrodes for sensing a user's touch in a capacitance manner, and touch lines for connecting the plurality of touch electrodes with the touch driver 400. In an embodiment, for example, the touch layer may sense a user's touch in a mutual capacitance manner or a self-capacitance manner. In an alternative embodiment, the touch layer may be disposed on a separate substrate disposed on the display layer DU. In such an embodiment, the substrate for supporting the touch layer may be a base member for encapsulating the display layer DU.

The color filter layer CFL may be disposed on the thin film encapsulation layer TFEL. The color filter layer CFL may include a plurality of color filters respectively corresponding to the plurality of light emission areas. Each of the color filters may selectively transmit light of a particular wavelength and block or absorb light of another wavelength. The color filter layer CFL may absorb a portion of light introduced from the outside of the display device 10 to reduce reflective light due to external light. Therefore, the color filter layer CFL may prevent distortion of a color, which is caused by external light reflection, from occurring.

In such an embodiment where the color filter layer CFL is directly disposed on the thin film encapsulation layer TFEL, the display device 10 may not include a separate substrate SUB for the color filter layer CFL. Therefore, a thickness of the display device 10 may be relatively small.

In some embodiments, the display device 10 may further include an optical device 500. The optical device 500 may be disposed in the second display area DA2 or the third display area DA3. The optical device 500 may emit or receive light of an infrared, ultraviolet or visible band. In an embodiment, for example, the optical device 500 may be an optical sensor for sensing light incident on the display device 10, such as a proximity sensor, an illuminance sensor and a camera sensor or an image sensor.

Figure 4:
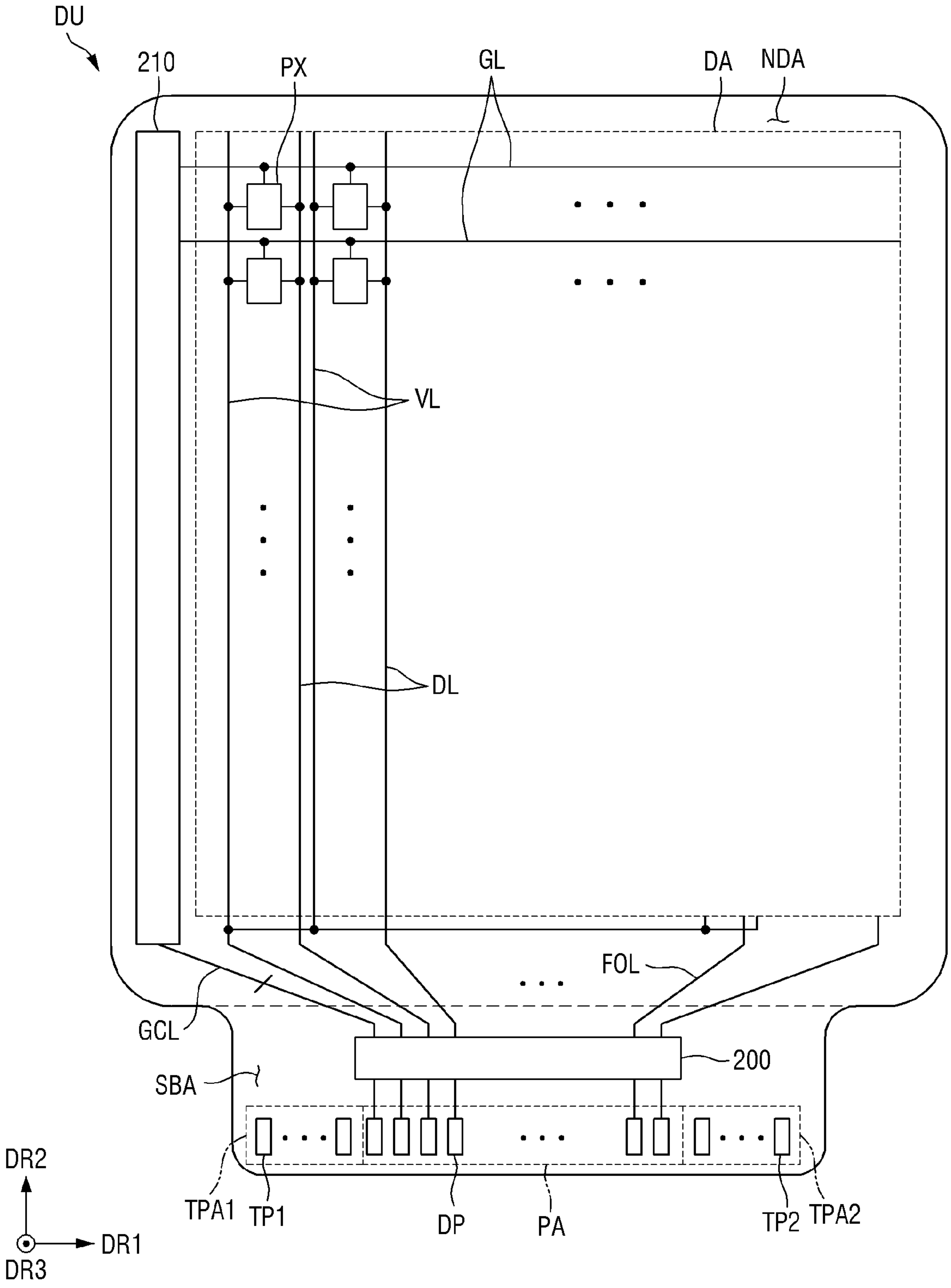
FIG. 4 is a plan view illustrating a display layer of a display device according to an embodiment.

FIG. 4 is a plan view illustrating a display layer of a display device according to an embodiment.

Referring to FIG. 4, an embodiment of the display layer DU may include a display area DA and a non-display area NDA.

The display area DA may be disposed at the center of the display panel 100. A plurality of pixels PX, a plurality of gate lines GL, a plurality of data lines DL and a plurality of power lines VL may be disposed in the display area DA. Each of the plurality of pixels PX may be defined as a minimum or basic unit for emitting light.

The plurality of gate lines GL may supply the gate signals received from a gate driver 210 to the plurality of pixels PX. The plurality of gate lines GL may extend in the first direction DR1, and may be spaced apart from each other in the second direction DR2 crossing the first direction DR1.

The plurality of data lines DL may supply the data voltages received from the display driver 200 to the plurality of pixels PX. The plurality of data lines DL may extend in the second direction DR2, and may be spaced apart from each other in the first direction DR1.

The plurality of power lines VL may supply the power voltage received from the display driver 200 to the plurality of pixels PX. The power voltage may be a driving voltage, an initialization voltage, a reference voltage or a low potential voltage. The plurality of power lines VL may extend in the second direction DR2, and may be spaced apart from each other in the first direction DR1.

The non-display area NDA may surround the display area DA. A gate driver 210, fan-out lines FOL and gate control lines GCL may be disposed in the non-display area NDA. The gate driver 210 may generate a plurality of gate signals based on the gate control signal, and may sequentially supply the plurality of gate signals to the plurality of gate lines GL in accordance with a set order.

The fan-out lines FOL may extend from the display driver 200 to the display area DA. The fan-out lines FOL may supply the data voltages received from the display driver 200 to the plurality of data lines DL.

The gate control line GCL may extend from the display driver 200 to the gate driver 210. The gate control line GCL may supply the gate control signal received from the display driver 200 to the gate driver 210.

The sub-area SBA may include a display driver 200, a pad area PA, and first and second touch pad areas TPA1 and TPA2.

The display driver 200 may output signals and voltages for driving the display panel 100 to the fan-out lines FOL. The display driver 200 may supply the data voltages to the data lines DL through the fan-out lines FOL. The data voltages may be supplied to the plurality of pixels PX, and may control luminance of the plurality of pixels PX. The display driver 200 may supply the gate control signal to the gate driver 210 through the gate control line GCL.

The pad area PA, the first touch pad area TPA1 and the second touch pad area TPA2 may be disposed at an edge of the sub-area SBA. The pad area PA, the first touch pad area TPA1 and the second touch pad area TPA2 may be electrically connected to the circuit board 300 by using a material such as an anisotropic conductive film or a self-assembly anisotropic conductive paste (SAP).

The pad area PA may include a plurality of display pad portions DP. The plurality of display pad portions DP may be connected to a graphic system through the circuit board 300. The plurality of display pad portion DP may be connected to the circuit board 300 to receive digital video data, and may supply the digital video data to the display driver 200.

Figure 5:
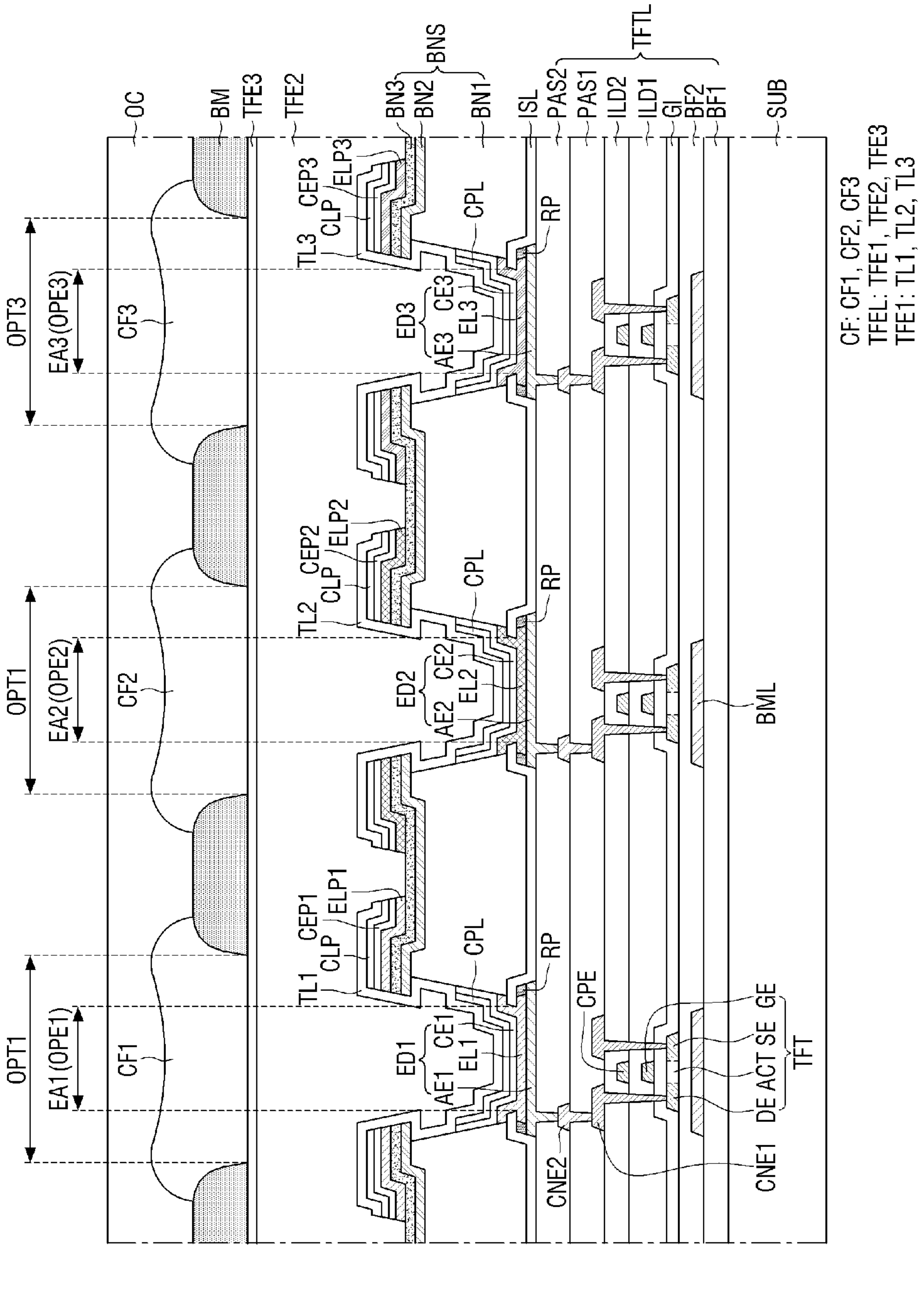
FIG. 5 is a cross-sectional view illustrating a portion of a display device according to an embodiment.

FIG. 5 is a cross-sectional view illustrating a portion of a display device according to an embodiment. FIG. 5 is a partial cross-sectional view of the display device 10 and illustrates a cross-section of a substrate SUB, a thin film transistor layer TFTL, a light emitting element layer EML and a thin film encapsulation layer TFEL of the display layer DU and a color filter layer CFL shown in FIG. 3.

Referring to FIGS. 3 and 5, in an embodiment, a display panel 100 of the display device 10 may include a display layer DU and a color filter layer CFL. The display layer DU may include a substrate SUB, a thin film transistor layer TFTL, a light emitting element layer EML and a thin film encapsulation layer TFEL. The display panel 100 includes a light shielding layer BM disposed on the thin film encapsulation layer TFEL and the color filters CF1, CF2 and CF3 of the color filter layer CFL may be disposed on the light shielding layer BM.

The substrate SUB may be a base substrate or a base member. The substrate SUB may be a flexible substrate capable of being subjected to bending, folding, rolling or the like. In an embodiment, for example, the substrate SUB may include a polymer resin such as polyimide (PI), but is not limited thereto. In an alternative embodiment, for example, the substrate SUB may include a glass material or a metal material.

The thin film transistor layer TFTL may include a first buffer layer BF1, a lower metal layer BML, a second buffer layer BF2, a thin film transistor TFT, a gate insulating layer GI, a first interlayer dielectric layer ILD1, a capacitor electrode CPE, a second interlayer dielectric layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing the air or moisture from being permeated thereinto. In an embodiment, for example, the first buffer layer BF1 may include a plurality of inorganic layers that are alternately stacked one on another.

The lower metal layer BML may be disposed on the first buffer layer BF1. In an embodiment, for example, the lower metal layer BML may be formed of or defined by a single layer or multiple layers, each layer including or made of at least one selected from molybdenum (Mo), aluminum (Al), chromium (Cr), gold (Au), titanium (Ti), nickel (Ni), neodymium (Nd) and copper (Cu), or an alloy thereof.

The second buffer layer BF2 may cover the first buffer layer BFT and the lower metal layer BML. The second buffer layer BF2 may include an inorganic layer capable of preventing permeation of the air or moisture from occurring. In an embodiment, for example, the second buffer layer BF2 may include a plurality of inorganic layers that are alternately stacked one on another.

The thin film transistor TFT may be disposed on the second buffer layer BF2, and may constitute a pixel circuit of each of a plurality of pixels. In an embodiment, for example, the thin film transistor TFT may be a driving transistor or a switching transistor of the pixel circuit. The thin film transistor TFT may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in the thickness direction, and may be insulated from the gate electrode GE by the gate insulating layer GI. A portion of the semiconductor layer ACT may form the source electrode SE and the drain electrode DE through conductorization (e.g., doping) of a material of the semiconductor layer ACT.

The gate electrode GE may be disposed on the gate insulating layer GI. The gate electrode GE may overlap the semiconductor layer ACT with the gate insulating layer GI interposed therebetween.

The gate insulating layer GI may be disposed on the semiconductor layer ACT. In an embodiment, for example, the gate insulating layer GI may cover the semiconductor layer ACT and the second buffer layer BF2, and may insulate the semiconductor layer ACT from the gate electrode GE. The gate insulating layer GI may be provided with a contact hole through which the first connection electrode CNE1 passes or is disposed. Here, the phrase "a layer is provided with a hole (or opening)" means that the hole (or opening) is defined or formed in or through the layer.

The first interlayer dielectric layer ILD1 may cover the gate electrode GE and the gate insulating layer GI. The first interlayer dielectric layer ILD1 may be provided with a contact hole through which the first connection electrode CNE1 passes or is disposed. The contact hole of the first interlayer dielectric layer ILD1 may be connected to (or aligned with) a contact hole of the gate insulating layer GI and a contact hole of the second interlayer dielectric layer ILD2.

The capacitor electrode CPE may be disposed on the first interlayer dielectric layer ILD1. The capacitor electrode CPE may overlap the gate electrode GE in the thickness direction. The capacitor electrode CPE and the gate electrode GE may form capacitance or collectively define a capacitor.

The second interlayer dielectric layer ILD2 may cover the capacitor electrode CPE and the first interlayer dielectric layer ILD1. The second interlayer dielectric layer ILD2 may be provided with a contact hole through which the first connection electrode CNE1 passes or is disposed. The contact hole of the second interlayer dielectric layer ILD2 may be connected to (or aligned with) the contact hole of the first interlayer dielectric layer ILD1 and the contact hole of the gate insulating layer GI.

The first connection electrode CNE1 may be disposed on the second interlayer dielectric layer ILD2. The first connection electrode CNE1 may electrically connect the drain electrode DE of the thin film transistor TFT with the second connection electrode CNE2. The first connection electrode CNE1 may be inserted into the contact holes provided or defined in the second interlayer dielectric layer ILD2, the first interlayer dielectric layer ILD1 and the gate insulating layer GI, and then may be in contact with the drain electrode DE of the thin film transistor TFT.

The first passivation layer PAS1 may cover the first connection electrode CNE1 and the second interlayer dielectric layer ILD2. The first passivation layer PAS1 may protect the thin film transistor TFT. The first passivation layer PAS1 may be provided with a contact hole through which the second connection electrode CNE2 passes or disposed.

The second connection electrode CNE2 may be disposed on the first passivation layer PAS1. The second connection electrode CNE2 may electrically connect the first connection electrode CNE1 with pixel electrodes AE1, AE2 and AE3 of the light emitting element ED. The second connection electrode CNE2 may be inserted into the contact hole defined or provided in the first passivation layer PAS1, and then may be in contact with the first connection electrode CNE1.

The second passivation layer PAS2 may cover the second connection electrode CNE2 and the first passivation layer PAS1. The second passivation layer PAS2 may be provided with a contact hole through which the pixel electrode AE1, AE2 or AE3 of the light emitting element ED passes or is disposed.

The light emitting element layer EML may be disposed on the thin film transistor layer TFTL. The light emitting element layer EML may include a light emitting element ED and a plurality of bank structures BNS. The light emitting element ED may include pixel electrodes AE1, AE2 and AE3, light emitting layers EL1, EL2 and EL3, and common electrodes CE1, CE2 and CE3.

Figure 6:
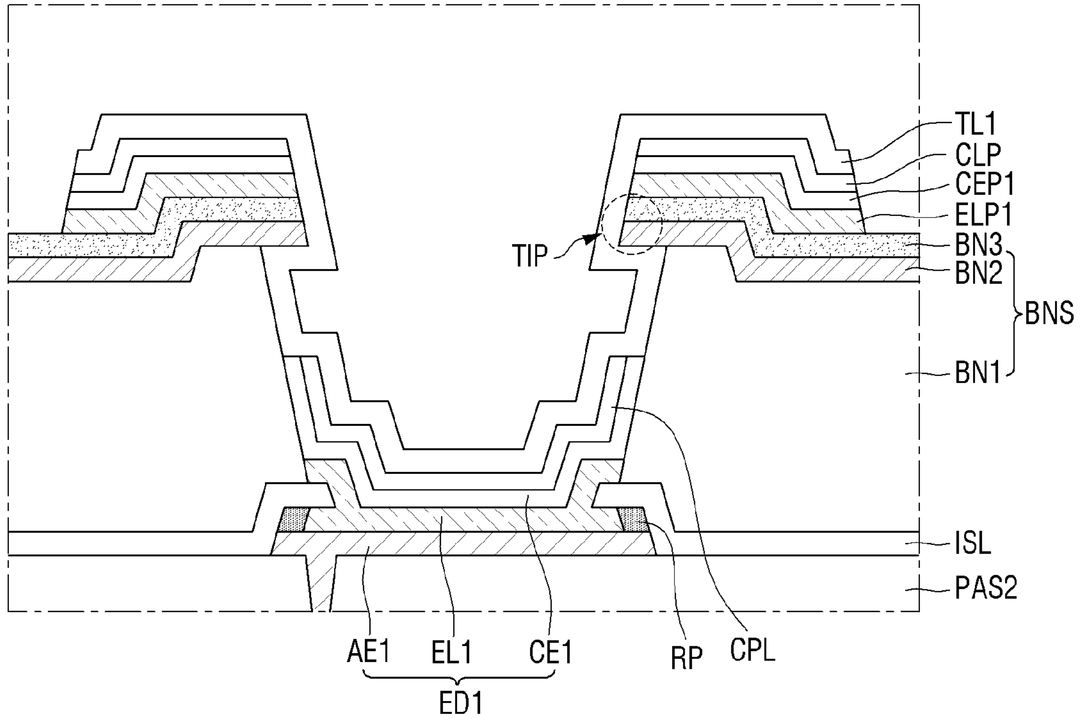
FIG. 6 is an enlarged view illustrating a first light emission area of FIG. 5.

FIG. 6 is an enlarged view illustrating a first light emission area of FIG. 5.

Referring to FIGS. 5 and 6, an embodiment of the display device 10 may include a plurality of light emission areas EA1, EA2 and EA3 disposed or defined in the display area DA. The light emission areas EA1, EA2 and EA3 may include a first light emission area EA1, a second light emission area EA2 and a third light emission area EA3, which emit light of different colors from each other. Each of the first to third light emission areas EA1, EA2 and EA3 may emit red light, green light or blue light, and a color of light emitted from each of the light emission areas EAT, EA2 and EA3 may vary depending on a type of the light emitting element ED disposed in the light emitting element layer EML. In an embodiment, the first light emission area EA1 may emit first light of a red color, the second light emission area EA2 may emit second light of a green color, and the third light emission area EA3 may emit third light of a blue color, but the disclosure is not limited thereto.

The first to third light emission areas EA1, EA2 and EA3 may be defined by a plurality of openings OPE1, OPE2 and OPE3 defined or formed in the bank structure BNS of the light emitting element layer EML, respectively. In an embodiment, for example, the first light emission area EA1 may be defined by a first opening OPE1 of the bank structure BNS, the second light emission area EA2 may be defined by a second opening OPE2 of the bank structure BNS, and the third light emission area EA3 may be defined by a third opening OPE3 of the bank structure BNS.

In an embodiment, areas or sizes of the first to third light emission areas EAT, EA2 and EA3 may be the same as one another. In an embodiment, for example, in the display device 10, the openings OPE1, OPE2 and OPE3 of the bank structures BNS may have a same diameter as each other, and the first light emission area EAT, the second light emission area EA2 and the third light emission area EA3 may have a same area as each other, but the disclosure is not limited thereto. In an alternative embodiment of the display device 10, the areas or sizes of the first to third light emission areas EA1, EA2 and EA3 may be different from one another. In an embodiment, for example, the area of the second light emission area EA2 may be greater than that of each of the first light emission area EA1 and the third light emission area EA3, and the area of the third light emission area EA3 may be greater than that of the first light emission area EA1. The intensity of light emitted from the corresponding light emission areas EA1, EA2 and EA3 may vary depending on the area of each of the light emission areas EA1, EA2 and EA3, and the area of each of the light emission areas EA1, EA2 and EA3 may be adjusted to control a color of a screen displayed on the display device 10 or the electronic device 1. In an embodiment, as shown in FIG. 5, the areas of the light emission areas EA1, EA2 and EA3 are the same as one another, but are not limited thereto. The areas of the light emission areas EA1, EA2 and EA3 may be variously adjusted depending on a color of a screen required by the display device 10 and the electronic device 1. In addition, the areas of the light emission areas EA1, EA2 and EA3 may be related to (or determined in consideration of) various factors such as light efficiency, lifespan of the light emitting element ED, etc., and may be in a trade-off relation with reflection by external light. The areas of the light emission areas EA1, EA2 and EA3 may be adjusted in consideration of the above factors.

In an embodiment of the display device 10, one first light emission area EA1, one second light emission area EA2 and one third light emission area EA3, which are disposed to be adjacent to one another, may form one pixel group. One pixel group may include light emission areas EA1, EA2 and EA3 that emit light of different colors to express a white gray scale, but is not limited thereto. Various modifications may be made in combination of the light emission areas EA1, EA2 and EA3 constituting one pixel group depending on the arrangement of the light emission areas EA1, EA2 and EA3 and a color of light emitted from each of the light emission areas EA1, EA2 and EA3.

The display device 10 may include a plurality of light emitting elements ED1, ED2 and ED3 disposed in light emission areas EA1, EA2 and EA3, respectively. The light emitting elements ED1, ED2 and ED3 may include a first light emitting element ED1 disposed in the first light emission area EA1, a second light emitting element ED2 disposed in the second light emission area EA2 and a third light emitting element ED3 disposed in the third light emission area EA3. The light emitting elements ED1, ED2 and ED3 include pixel electrodes AE1, AE2 and AE3, light emitting layers EL1, EL2 and EL3 and common electrodes CE1, CE2 and CE3. The light emitting elements ED1, ED2 and ED3 disposed in different light emission areas EA1, EA2 and EA3 may emit light of different colors depending on materials of the light emitting layers EL1, EL2 and EL3. In an embodiment, for example, the first light emitting element ED1 disposed in the first light emission area EA1 may emit red light of a first color, the second light emitting element ED2 disposed in the second light emission area EA2 may emit green light of a second color, and the third light emitting element ED3 disposed in the third light emission area EA3 may emit blue light of a third color. The first to third light emission areas EA1, EA2 and EA3 constituting one pixel may include light emitting elements ED1, ED2 and ED3 that emit light of different colors from each other, thereby expressing a white gray scale.

The pixel electrodes AE1, AE2 and AE3 may be disposed on the second passivation layer PAS2. The pixel electrodes AE1, AE2 and AE3 may be disposed to overlap one of the openings OPE1, OPE2 and OPE3 of the bank structure BNS. The pixel electrodes AE1, AE2 and AE3 may be electrically connected to the drain electrode DE of the thin film transistor TFT through the first and second connection electrodes CNE1 and CNE2.

The pixel electrodes AE1, AE2 and AE3 may be respectively disposed in the plurality of emission areas EA1, EA2 and EA3. The pixel electrodes AE1, AE2 and AE3 may include a first pixel electrode AE1 disposed in the first light emission area EA1, a second pixel electrode AE2 disposed in the second light emission area EA2 and a third pixel electrode AE3 disposed in the third light emission area EA3. The first pixel electrode AE1, the second pixel electrode AE2 and the third pixel electrode AE3 may be spaced apart from one another on the second passivation layer PAS2. The pixel electrodes AE1, AE2 and AE3 may be respectively disposed in different emission areas EA1, EA2 and EA3 to constitute the light emitting elements ED1, ED2 and ED3 that emit light of different colors from each other.

An inorganic insulating layer ISL may be disposed on the second passivation layer PAS2 and the pixel electrodes AE1, AE2 and AE3. The inorganic insulating layer ISL may be entirely disposed on the second passivation layer PAS2, and may partially overlap the pixel electrodes AE1, AE2 and AE3 to expose a portion of upper surfaces of the pixel electrodes AE1, AE2 and AE3. The inorganic insulating layer ISL may expose the pixel electrodes AE1, AE2 and AE3 in a portion that overlaps the openings OPE1, OPE2 and OPE3 of the bank structure BNS, and the light emitting layers EL1, EL2 and EL3 disposed on the pixel electrodes AE1, AE2 and AE3 may be directly disposed on the pixel electrodes AE1, AE2 and AE3. The inorganic insulating layer ISL may include an inorganic insulating material. For example, the inorganic insulating layer ISL may include aluminum oxide, titanium oxide, tantalum oxide, hafnium oxide, zinc oxide, silicon oxide, silicon nitride and/or silicon oxynitride.

According to an embodiment, the inorganic insulating layer ISL is disposed on the pixel electrodes AE1, AE2 and AE3, and may be spaced apart from the upper surfaces of the pixel electrodes AE1, AE2 and AE3. The inorganic insulating layer ISL may partially overlap the pixel electrodes AE1, AE2 and AE3 and may not be directly in contact with an upper surface of the pixel electrodes AE1, AE2 and AE3, and a portion of the light emitting layers EL1, EL2 and EL3 of the light emitting elements ED1, ED2 and ED3 may be disposed between the inorganic insulating layer ISL and the pixel electrodes AE1, AE2 and AE3. In an embodiment of a fabricating process of the display device 10, a sacrificial layer SFL (shown in FIG. 9) may be disposed on the pixel electrodes AE1, AE2 and AE3 before the inorganic insulating layer ISL is formed. The inorganic insulating layer ISL is disposed to cover a portion of the sacrificial layer, and may be spaced apart from the upper surfaces of the pixel electrodes AE1, AE2 and AE3 as the sacrificial layer SFL is removed. In an embodiment, a residual pattern RP of the sacrificial layer SFL may remain on the pixel electrodes AE1, AE2 and AE3, as shown in FIG. 6. Afterwards, a portion of the inorganic insulating layer ISL may be disposed on the light emitting layers EL1, EL2 and EL3 while materials forming the light emitting layers EL1, EL2 and EL3 are being filled between the inorganic insulating layer ISL and the pixel electrodes AE1, AE2 and AE3 in a deposition process of the light emitting layers EL1, EL2 and EL3. In an alternative embodiment, the inorganic insulating layer ISL may be directly in contact with (i.e., directly contacting or in direct contact with) sides of the pixel electrodes AE1, AE2 and AE3.

The display device 10 may include a plurality of bank structures BNS disposed on the thin film transistor layer TFTL on the substrate SUB, and a plurality of openings OPE1, OPE2 and OPE3 may be defined in the bank structures BNS. The bank structure BNS may have a structure in which bank layers BN1, BN2 and BN3 including different materials from each other are sequentially stacked, and may be provided with a plurality of openings OPE1, OPE2 and OPE3 defining the light emission areas EA1, EA2 and EA3. The light emitting elements ED1, ED2 and ED3 of the display device 10 may be disposed to overlap the openings OPEL, OPE2 and OPE3 of the bank structure BNS.

The bank structure BNS may include a first bank layer BN1 disposed on the inorganic insulating layer ISL, a second bank layer BN2 disposed on the first bank layer BN1, and a third bank layer BN3 disposed on the second bank layer BN2.

According to an embodiment, the first bank layer BN1 and the second bank layer BN2 may respectively include metal materials different from each other, and the second bank layer BN2 of the bank structure BNS may include a tip protruded from the first bank layer BN1 toward the opening OPE1, OPE2 and OPE3. Sides of the first bank layer BN1 in the bank structure BNS may have a shape recessed inward from a side of the second bank layer BN2. In the bank structure BNS, the first bank layer BN1 may be thicker than the second bank layer BN2, and the second bank layer BN2 may be relatively thin and may be provided with a tip TIP formed in the fabricating process. As the second bank layer BN2 has a shape more protruded toward the openings OPE1, OPE2 and OPE3 than the first bank layer BN1, an undercut may be formed below the tip TIP of the second bank layer BN2.

A sidewall shape of the bank structure BNS may be a structure formed due to an etch rate difference in an etching process as the first bank layer BN1 and the second bank layer BN2 includes different materials from each other. According to an embodiment, the second bank layer BN2 may include a material having an etch rate lower than that of the first bank layer BN1, and the first bank layer BN1 may be further etched in the process of forming the openings OPE1, OPE2 and OPE3 of the bank structure BNS so that an undercut may be formed below the tip TIP of the second bank layer BN2. In an embodiment, the first bank layer BN1 may include a metal material having high electrical conductivity, and the second bank layer BN2 may include a metal material having low reflectance. In an embodiment, for example, the first bank layer BN1 may include aluminum (Al), and the second bank layer BN2 may include titanium (Ti). The bank structure BNS may have a structure in which Al/Ti are stacked from the inorganic insulating layer ISL, and the tip TIP may be formed in a Ti-layer of the second bank layer BN2.

The bank structure BNS is provided with the openings OPE1, OPE2 and OPE3 defining the light emission areas EA1, EA2 and EA3, and may be disposed to overlap the light shielding layer BM that will be described later. The uppermost layer of the bank structure BNS may include a material having low reflectance to reduce reflection of external light. In addition, the first bank layer BN1 in the bank structure BNS may be electrically connected to the common electrodes CE1, CE2 and CE3 of the different light emitting elements EDT, ED2 and ED3. The common electrodes CE1, CE2 and CE3 of the different light emitting elements ED1, ED2 and ED3 disposed in the different light emission areas EA1, EA2 and EA3 are not directly connected to each other, but may be electrically connected to each other through the first bank layer BN1 of the bank structure BNS.

In the fabricating process of the display device 10, a pixel defining layer defining the light emission areas EA1, EA2 and EA3 is formed of an organic material, or a mask process may be used to form the light emitting layers EL1, EL2 and EL3 of the light emitting elements ED1, ED2 and ED3 in the respective light emission areas EA1, EA2 and EA3. In this process, the display device 10 may be desired to include a structure for holding a mask, or to increase a size of the non-display area NDA to control distribution according to the mask process to perform the mask process. In a case where the mask process is minimized, an undesired element, for example, a structure for holding a mask may be omitted from the display device 10, and the size of the non-display area NDA for distribution control may be minimized.

The display device 10 according to an embodiment includes the bank structure BNS forming the light emission areas EAT, EA2 and EA3, and the bank structure BNS may be formed by deposition and etching processes instead of the mask process. In such an embodiment, as the bank structure BNS has a structure in which the first bank layer BN1 and the second bank layer BN2 include respectively metal materials different from each other so that inner sidewalls of the bank structure BNS defining the openings OPE1, OPE2 and OPE3 include a tip TIP, different layers may be separately formed in the different light emission areas EA1, EA2 and EA3 even by the deposition process. In an embodiment, for example, even though the light emitting layers ELT, EL2 and EL3 and the common electrodes CE1, CE2 and CE3 of the light emitting elements ED1, ED2, ED3 are formed by the deposition process without using a mask, materials deposited in the different light emission areas EA1, EA2 and EA3 defined by the openings OPE1, OPE2 and OPE3 may be disconnected from each other (i.e., without being connected to each other) by the tip TIP of the second bank layer BN2, which is formed on the inner sidewalls of the bank structure BNS defining the openings OPE1, OPE2 and OPE3. After a material for forming a specific layer is formed on a front surface of the display device 10, different layers may be separately formed in the different light emission areas EAT, EA2 and EA3 through a process of etching and removing a layer formed in an undesired area. In the display device 10, the different light emitting elements ED1, ED2 and ED3 may be formed for the respective light emission areas EA1, EA2 and EA3 through the deposition and etching processes without using a mask process, undesired elements provided in the display device 10 for a mask process may be omitted, and the size of the non-display area NDA may be minimized.

In an embodiment, as will be described later, a first encapsulation layer TFE1 of the thin film encapsulation layer TFEL may be disposed on the common electrodes CE1, CE2 and CE3 of the light emitting elements ED1, ED2 and ED3. The first encapsulation layer TFE1 may include a first inorganic layer TL1 disposed on the first light emitting element EDT, a second inorganic layer TL2 disposed on the second light emitting element ED2, and a third inorganic layer TL3 disposed on the third light emitting element ED3. The first to third inorganic layers TL1, TL2 and TL3 are entirely formed on the bank structure BNS and then disposed to cover only the light emitting elements ED1, ED2 and ED3 in the respective light emission areas EA1, EA2 and EA3 and organic patterns ELP1, ELP2 and ELP3 and electrode pattern CEP1, CEP2 and CEP3, which will be described later, and may not be disposed among the light emission areas EA1, EA2 and EA3. The inorganic layers TL1, TL2 and TL3 may have a patterned shape as the inorganic layers TL1, TL2 and TL3 are formed to completely cover the bank structure BNS and partially patterned. The inorganic layers TL1, TL2 and TL3 may include an inorganic insulating material, and an etchant capable of etching the inorganic insulating material may be used for the patterning process of the inorganic layers TL1, TL2 and TL3. When the second bank layer BN2 of the bank structure BNS is exposed in the patterning process, the second bank layer BN2 may be partially removed or damaged by a specific etchant.

In an embodiment, each of the first inorganic layer TL1, the second inorganic layer TL2 and the third inorganic layer TL3 is patterned in a separate process, and the patterning process of the inorganic layers TL1, TL2 and TL3 may be repeated several times. When the second bank layer BN2 is exposed for each repeated patterning process, a thickness of the second bank layer BN2 may be reduced, and the tip TIP of the second bank layer BN2 may be thinned in the bank structure BNS. In an embodiment, for example, when processes of forming the first light emitting element ED1, the second light emitting element ED2 and the third light emitting element ED3 are sequentially performed, the second bank layer BN2 near the third opening OPE3 may be placed in the weakest state.

In this case, the tip TIP of some openings OPE1, OPE2 and OPE3, for example, the tip TIP of the third opening OPE3 may be sagged without maintaining a shape protruded from the sidewall of the first bank layer BN1. If the tip TIP is sagged, a side contact between the common electrodes CE1, CE2 and CE3 of the light emitting elements ED1, ED2 and ED3 and the first bank layer BN1 may not be effectively made. Therefore, a contact resistance between the common electrode CE1, CE2 and CE3 and the first bank layer BN1 may be increased, which may cause luminance deterioration of some of the light emitting elements ED1, ED2 and ED3 to generate a spot in the display device 10.

The display device 10 according to an embodiment may further include a third bank layer BN3 disposed on the second bank layer BN2 to prevent the second bank layer BN2 of the bank structure BNS from being damaged in the fabricating process. The third bank layer BN3 may form the tip TIP protruded from the sidewall of the first bank layer BN1 together with the second bank layer BN2. The third bank layer BN3 may include a material which is not a metal, unlike the first bank layer BN1 and the second bank layer BN2, and may have resistance to an etchant used for patterning of the inorganic layers TL1, TL2 and TL3 not to be substantially etched. The second bank layer BN2 may be protected by the third bank layer BN3 in the patterning process of the inorganic layers TL1, TL2 and TL3, and may have a uniform thickness throughout the bank structure BNS. The tip TIP of the second bank layer BN2 in the bank structure BNS may have substantially the same thickness or constant thickness regardless of the positions of the openings OPE1, OPE2 and OPE3. Therefore, the display device 10 may effectively prevent the tip TIP of the second bank layer BN2 from being sagged in the plurality of openings OPE1, OPE2 and OPE3 of the bank structure BNS, and may have uniform luminance for each of the light emitting elements ED1, ED2 and ED3 to prevent a spot from occurring.

According to an embodiment, the third bank layer BN3 may include a layer including or formed of an amorphous oxide semiconductor layer. In an embodiment, as shown in FIGS. 5 and 6, the third bank layer BN3 may be formed of or defined by a single layer, but is not limited thereto. In an embodiment, the third bank layer BN3 may be formed of or defined by at least one layer, or may be formed of a double layer, a triple layer or more layers, which include the same or different oxide semiconductors from each other.

In an embodiment, the third bank layer BN3 may have a thickness in a range of about 100 angstroms (Å) to about 1500 Å, and may be formed of or defined by an oxide semiconductor layer that includes at least one selected from indium zinc oxide (IZO), indium gallium zinc oxide (IGZO), indium tin gallium zinc oxide (ITGZO), indium tin oxide (ITO), indium tin zinc oxide (ITZO), indium tin gallium oxide (ITGO) and indium gallium oxide (IGO). The third bank layer BN3 may include an oxide semiconductor layer include or made of at least one selected from the above materials in an amorphous state. In an embodiment in which the third bank layer BN3 includes IZO, ZnO in IZO may include a content of about 10 weight percent (wt %) to about 20 wt %. In an embodiment in which the third bank layer BN3 includes IGZO, a composition ratio of In:Ga:Zn may be 1:1:1. In an embodiment in which the third bank layer BN3 includes ITGZO, the ITGZO may be formed based on IGZO in which Sn is doped in a content of about 1 atomic percent (at %) to about 5 at %, but is not limited thereto.

The display device 10 may include patterns formed based on the patterning and deposition process of the bank structure BNS. The patterns may be formed simultaneously with the light emitting layers EL1, EL2 and EL3 and the common electrodes CE1, CE2 and CE3 of the light emitting elements ED1, ED2 and ED3, and may remain on the bank structure BNS. Hereinafter, the structures of the light emitting layers EL1, EL2 and EL3 and the common electrodes CE1, CE2 and CE3, and the patterns will be described.

The light emitting layers EL1, EL2 and EL3 may be disposed on the pixel electrodes AE1, AE2 and AE3. The light emitting layers EL1, EL2 and EL3 may be organic light emitting layers including or made of an organic material, and may be formed on the pixel electrodes AE1, AE2 and AE3 through a deposition process. When the thin film transistor TFT applies a predetermined voltage of the pixel electrodes AE1, AE2 and AE3 of the light emitting elements ED1, ED2 and ED3 and the common electrodes CE1, CE2 and CE3 of the light emitting elements ED1, ED2 and ED3 receive a common voltage or a cathode voltage, holes and electrons may be transferred to the light emitting layers EL1, EL2 and EL3 through the hole transporting layer and the electron transporting layer, and may be combined with each other in the light emitting layers EL1, EL2 and EL3 to emit light.

The light emitting layers EL1, EL2 and EL3 may include a first light emitting layer EL1, a second light emitting layer EL2 and a third light emitting layer EL3, which are respectively disposed in different light emission areas EA1, EA2 and EA3. The first light emitting layer ELT may be disposed on the first pixel electrode AE1 in the first light emission area EA1, the second light emitting layer EL2 may be disposed on the second pixel electrode AE2 in the second light emission area EA2, and the third light emitting layer EL3 may be disposed on the third pixel electrode AE3 in the third light emission area EA3. The first to third light emitting layers ELT, EL2 and EL3 may be light emitting layers of the first to third light emitting elements ED1, ED2 and ED3, respectively. The first light emitting layer ELT may be a light emitting layer that emits red light of a first color, the second light emitting layer EL2 may be a light emitting layer that emits green light of a second color, and the third light emitting layer EL3 may be a light emitting layer that emits blue light of a third color.

According to an embodiment, a portion of the light emitting layers ELT, EL2 and EL3 of the light emitting elements EDT, ED2 and ED3 may be disposed between the pixel electrodes AE1, AE2 and AE3 and the inorganic insulating layer ISL. The inorganic insulating layer ISL may be disposed on the pixel electrodes AE1, AE2 and AE3, and may be spaced apart from the upper surfaces of the pixel electrodes AE1, AE2 and AE3. The deposition process of the light emitting layers EL1, EL2 and EL3 may be performed in a way such that a material of the light emitting layer is deposited in an inclined direction that is not perpendicular to the upper surface of the substrate SUB. Therefore, the light emitting layers EL1, EL2 and EL3 may be disposed to fill the upper surfaces of the pixel electrodes AE1, AE2 and AE3 exposed to the openings OPE1, OPE2 and OPE3 of the bank structure BNS and the space between the pixel electrodes AE1, AE2 and AE3 and the inorganic insulating layer ISL.

In an embodiment of the fabricating process of the display device 10, a sacrificial layer SFL (shown in FIG. 7) is disposed between the inorganic insulating layer ISL and the pixel electrodes AE1, AE2 and AE3 and then the light emitting layers EL1, EL2 and EL3 may be disposed in an area from the sacrificial layer SFL is partially removed. Therefore, a lower surface of the inorganic insulating layer ISL may be spaced apart from the pixel electrodes AE1, AE2 and AE3. The sacrificial layer SFL may partially remain as a residual pattern RP in an area between the inorganic insulating layer ISL and the pixel electrodes AE1, AE2 and AE3. The area between the inorganic insulating layer ISL and the pixel electrodes AE1, AE2 and AE3 may be filled with the residual pattern RP and the light emitting layers EL1, EL2 and EL3.

The display device 10 according to an embodiment may include a plurality of organic patterns ELP1, ELP2 and ELP3 disposed on the bank structure BNS and including same materials as the light emitting layers EL1, EL2 and EL3, respectively. Since the light emitting layers EL1, EL2 and EL3 are formed by a process of depositing a material on the front surface of the display device 10, the material for forming the light emitting layers EL1, EL2 and EL3 may be also deposited on the bank structure BNS in addition to the openings OPE1, OPE2 and OPE3 of the bank structures BNS.

In an embodiment, for example, the display device 10 may include organic patterns ELP1, ELP2 and ELP3 disposed above the bank structure BNS. The organic patterns ELP1, ELP2 and ELP3 may include a first organic pattern ELP1, a second organic pattern ELP2 and a third organic pattern ELP3, which are disposed on the third bank layer BN3 of the bank structure BNS.

The first organic pattern ELP1 may include the same material as that of the first light emitting layer EL1 of the first light emitting element ED1. The second organic pattern ELP2 may include the same material as that of the second light emitting layer EL2 of the second light emitting element ED2, and the third organic pattern ELP3 may include the same material as that of the third light emitting layer EL3 of the third light emitting element ED3. Each of the organic patterns ELP1, ELP2 and ELP3 may be formed in a same process as that of the light emitting layers EL1, EL2 and EL3 including the same material.

The first organic pattern ELP1, the second organic pattern ELP2 and the third organic pattern ELP3 may be disposed directly on the third bank layer BN3 of the bank structure BNS. Each of the organic patterns ELP1, ELP2 and ELP3 may be formed in the same process as that of the light emitting layers EL1, EL2 and EL3 including the same material, and may be disposed to be adjacent to the light emission areas EA1, EA2 and EA3 in which the light emitting layers EL1, EL2 and EL3 are respectively disposed. In an embodiment, for example, the first organic pattern ELP1 may be disposed on the third bank layer BN3 while surrounding the first opening OPE1 near the first light emission area EA1 or the first opening OPE1. The second organic pattern ELP2 may be disposed on the third bank layer BN3 while surrounding the second opening OPE2 near the second light emission area EA2 or the second opening OPE2, and the third organic pattern ELP3 may be disposed on the third bank layer BN3 while surrounding the third opening OPE3 near the third light emission area EA3 or the third opening OPE3.

The organic patterns ELP1, ELP2 and ELP3 may be patterns formed by being disconnected from each other without being connected to the light emitting layers EL1, EL2 and EL3 adjacent thereto as the bank structure BNS includes the tip TIP. The light emitting layers EL1, EL2 and EL3 may be formed in the openings OPE1, OPE2 and OPE3, and the organic patterns ELP1, ELP2 and ELP3 may be disconnected from the light emitting layers EL1, EL2 and EL3 by the tip TIP formed on the sidewalls of the bank structure BNS defining the openings OPE1, OPE2 and OPE3. As the light emitting layers EL1, EL2 and EL3 are formed by the deposition process without using a mask, the materials of the light emitting layers EL1, EL2 and EL3 may be entirely formed on the bank structure BNS, and may be patterned near each of the light emission areas EA1, EA2 and EA3 or the openings OPE1, OPE2 and OPE3 to form the organic patterns ELP1, ELP2 and ELP3.

The common electrodes CE1, CE2 and CE3 may be disposed on the light emitting layers EL1, EL2 and EL3. The common electrodes CE1, CE2 and CE3 may include a transparent conductive material to emit light generated from the light emitting layers EL1, EL2 and EL3. The common electrodes CE1, CE2 and CE3 may receive a common voltage or a low potential voltage. When the pixel electrodes AE1, AE2 and AE3 receive a voltage corresponding to the data voltage and the common electrodes CE1, CE2 and CE3 receive the low potential voltage, a potential difference is formed between the pixel electrodes AE1, AE2 and AE3 and the common electrodes CE1, CE2 and CE3, so that the light emitting layers EL1, EL2 and EL3 may emit light.

The common electrodes CE1, CE2 and CE3 may include a first common electrode CE1, a second common electrode CE2 and a third common electrode CE3, which are respectively disposed in the different emission areas EAT, EA2 and EA3. The first common electrode CE1 may be disposed on the first light emitting layer EL1 in the first light emission area EA1, the second common electrode CE2 may be disposed on the second light emitting layer EL2 in the second light emission area EA2, and the third common electrode CE3 may be disposed on the third light emitting layer EL3 in the third light emission area EA3.

According to an embodiment, a portion of the common electrodes CE1, CE2 and CE3 of the light emitting elements ED1, ED2 and ED3 may be disposed on the side surface of the first bank layer BN1 of the bank structure BNS. Similarly to the light emitting layers ELT, EL2 and EL3, the common electrodes CE1, CE2 and CE3 may be also formed through a deposition process. The deposition process of the common electrodes CE1, CE2 and CE3 may be performed in a way such that an electrode material is deposited in an inclined direction that is not perpendicular to the upper surface of the substrate SUB. Therefore, the common electrodes CE1, CE2 and CE3 may be disposed on the side surface of the first bank layer BN1 below the tip TIP of the second bank layer BN2 of the bank structure BNS. The common electrodes CE1, CE2 and CE3 may be directly in contact with the side surface of the first bank layer BN1. The common electrodes CE1, CE2 and CE3 of the different light emitting elements ED1, ED2 and ED3 may be directly in contact with the first bank layer BN1 of the bank structure BNS, and the common electrodes CE1, CE2 and CE3 may be electrically connected to one another through the first bank layer BN1. Unlike the pixel electrodes AE1, AE2 and AE3, the common electrodes CE1, CE2 and CE3 may be implemented in the form of electrodes that are electrically common for all the pixels without being distinguished for each of the plurality of pixels.

According to an embodiment, a contact area in which the common electrodes CE1, CE2 and CE3 are in contact with the side surface of the first bank layer BN1 may be greater than that in which the light emitting layers ELT, EL2 and EL3 are in contact with the side surface of the first bank layer BN1. The common electrodes CE1, CE2 and CE3 and the light emitting layers ELT, EL2 and EL3 are formed in a way such that the materials thereof are deposited in an inclined direction that is not perpendicular to the upper surface of the substrate SUB, and contact areas thereof on the side surface of the first bank layer BN1 may be varied depending on the inclined angle. In an embodiment, the deposition process of the common electrodes CE1, CE2 and CE3 may be performed in a direction more inclined than that of the deposition process of the light emitting layers EL1, EL2 and EL3. The common electrodes CE1, CE2 and CE3 may be disposed at a greater area than the light emitting layers EL1, EL2 and EL3 on the sidewalls of the bank structure BNS defining the openings OPE1, OPE2 and OPE3 or may be disposed to reach a higher position from the sidewalls of the bank structure BNS defining the openings OPE1, OPE2 and OPE3. Since the common electrodes CE1, CE2 and CE3 of the different light emitting elements ED1, ED2 and ED3 are electrically connected to each other through the first bank layer BN1, it may be desired that the common electrodes CE1, CE2 and CE3 are in contact the first bank layer BN1 at a greater area.

In an embodiment, the bank structure BNS includes a third bank layer BN3 such that the tip TIP of the second bank layer BN2 may maintain a uniform shape regardless of the type of the openings OPE1, OPE2 and OPE3. As the tip TIP of the second bank layer BN2 is protruded without being sagged, the common electrodes CE1, CE2 and CE3 of the different light emitting elements ED1, ED2 and ED3 may have a same contact area with the side surface of the first bank layer BN1.

The display device 10 according to an embodiment of the disclosure, the display device 10 may include a plurality of electrode patterns CEP1 CEP2 and CEP3 that include the same material as that of the common electrodes CE1, CE2 and CE3 and are disposed on the bank structure BNS. Since the common electrodes CE1, CE2 and CE3 are formed by a process of depositing a material on the front surface of the display device 10, the material forming the common electrodes CE1, CE2 and CE3 may be also deposited on the bank structure BNS in addition to the openings OPE1, OPE2 and OPE3 of the bank structure BNS.

The display device 10 may include electrode patterns CEP1, CEP2 and CEP3 disposed above the bank structure BNS. The electrode patterns CEP1, CEP2 and CEP3 may include a first electrode pattern CEP1, a second electrode pattern CEP2 and a third electrode pattern CEP3, which are disposed on the third bank layer BN3 of the bank structure BNS.

In an embodiment, for example, the first electrode pattern CEP1, the second electrode pattern CEP2 and the third electrode pattern CEP3 may be disposed directly on the first organic pattern ELP1, the second organic pattern ELP2 and the third organic pattern ELP3, respectively. The arrangement relation of the electrode patterns CEP1, CEP2 and CEP3 and the organic patterns ELP1, ELP2 and ELP3 may be the same as that of the light emitting layers EL1, EL2 and EL3 and the common electrodes CE1, CE2 and CE3 of the light emitting elements ED1, ED2 and ED3. The electrode patterns CEP1, CEP2 and CEP3 may be patterns formed from the deposited material that is disconnected from the common electrodes CE1, CE2 and CE3 without being connected to the common electrodes CE1, CE2 and CE3 as the bank structure BNS includes the tip TIP. In an embodiment of the display device 10, the common electrodes CE1, CE2 and CE3 may be individually in different areas even in a deposition process, in which a mask is not used, by the tip TIP of the bank structure BNS.

A capping layer CPL may be disposed on the common electrodes CE1, CE2 and CE3. The capping layer CPL may include an inorganic insulating material to cover patterns disposed on the light emitting elements ED1, ED2 and ED3 and the bank structure BNS. The capping layer CPL may prevent the light emitting elements ED1, ED2 and ED3 from being damaged from the external air, and may prevent patterns disposed on the bank structure BNS from being delaminated during the fabricating process of the display device 10. In an embodiment, the capping layer CPL may include aluminum oxide, titanium oxide, tantalum oxide, hafnium oxide, zinc oxide, silicon oxide, silicon nitride and/or silicon oxynitride.

The display device 10 may include a capping pattern CLP disposed above the bank structure BNS. The capping pattern CLP may be disposed directly on the first electrode pattern CEP1, the second electrode pattern CEP2 and the third electrode pattern CEP3, which are disposed on the third bank layer BN3 of the bank structure BNS. The arrangement relation of the capping pattern CLP and the electrode patterns CEP1, CEP2 and CEP3 may be the same as that of the common electrodes CE1, CE2 and CE3 of the light emitting elements ED1, ED2 and ED3 and the capping layer CPL. The capping pattern CLP may be a pattern formed from the deposited material that is disconnected from the capping layer CPL without being connected to the capping layer CPL as the bank structure BNS includes the tip TIP.

The plurality of organic patterns ELP1, ELP2 and ELP3, the electrode patterns CEP1, CEP2 and CEP3 and the capping pattern CLP may be disposed on the bank structure BNS, and may be disposed to surround the periphery of the light emission areas EA1, EA2 and EA3 or the openings OPE1, OPE2 and OPE3. A stacked structure of the organic patterns ELP1, ELP2 and ELP3, the electrode patterns CEP1, CEP2 and CEP3 and the capping pattern CLP, which are disposed near the light emission areas EA1, EA2 and EA3, are partially etched in the fabricating process of the display device 10, such that a pattern shape may be changed. Therefore, a portion of the upper surface of the third bank layer BN3 of the bank structure BNS may not be covered by the organic patterns ELP1, ELP2 and ELP3, the electrode patterns CEP1, CEP2 and CEP3 and the capping pattern CLP.

The thin film encapsulation layer TFEL may be disposed on the light emitting elements ED1, ED2 and ED3 and the bank structure BNS, and may cover the plurality of light emitting elements ED1, ED2 and ED3 and the bank structure BNS. The thin film encapsulation layer TFEL may include at least one inorganic layer to prevent oxygen or moisture from being permeated into the light emitting element layer EML. The thin film encapsulation layer TFEL may further include at least one organic layer to protect the light emitting element layer EML from particles such as dust.

In an embodiment, the thin film encapsulation layer TFEL may include a first encapsulation layer TFE1, a second encapsulation layer TFE2 and a third encapsulation layer TFE3, which are sequentially stacked. The first encapsulation layer TFE1 and the third encapsulation layer TFE3 may be inorganic encapsulation layers, and the second encapsulation layer TFE2 disposed therebetween may be an organic encapsulation layer.

Each of the first encapsulation layer TFE1 and the third encapsulation layer TFE3 may include one or more inorganic insulating materials. The inorganic insulating materials may include aluminum oxide, titanium oxide, tantalum oxide, hafnium oxide, zinc oxide, silicon oxide, silicon nitride and/or silicon oxynitride.

The second encapsulation layer TFE2 may include a polymer-based material. The polymer-based material may include an acrylic resin, an epoxy-based resin, polyimide and polyethylene. In an embodiment, the second encapsulation layer TFE2 may include an acrylic resin, for example, polymethyl methacrylate, polyacrylic acid, or the like. The second encapsulation layer TFE2 may be formed by curing a monomer or applying a polymer.

The first encapsulation layer TFE1 may be disposed on the light emitting elements ED1, ED2 and ED3, the plurality of patterns and the bank structure BNS. The first encapsulation layer TFE1 may include a first inorganic layer TL1, a second inorganic layer TL2 and a third inorganic layer TL3, which are disposed to correspond to the different light emission areas EA1, EA2 and EA3, respectively.

The first inorganic layer TL1, the second inorganic layer TL2 and the third inorganic layer TL3 may respectively include an inorganic insulating material to cover the light emitting elements ED1, ED2 and ED3. The first inorganic layer TL1, the second inorganic layer TL2 and the third inorganic layer TL3 may prevent the light emitting elements EDT, ED2 and ED3 from being damaged from the external air, and the patterns disposed on the bank structure BNS may be prevented from being delaminated during the fabricating process of the display device 10. In an embodiment, the first inorganic layer TL1, the second inorganic layer TL2 and the third inorganic layer TL3 may include aluminum oxide, titanium oxide, tantalum oxide, hafnium oxide, zinc oxide, silicon oxide, silicon nitride and/or silicon oxynitride.

The first inorganic layer TL1, the second inorganic layer TL2 and the third inorganic layer TL3 may be disposed to cover the organic patterns ELP1, ELP2 and ELP3, the electrode patterns CEP1, CEP2 and CEP3 and the capping pattern CLP. The first inorganic layer TL1, the second inorganic layer TL2 and the third inorganic layer TL3 may be formed by chemical vapor deposition (CVD), and thus may be formed to have a uniform thickness along a step difference of the layers that are deposited. In an embodiment, for example, the first inorganic layer TL1, the second inorganic layer TL2 and the third inorganic layer TL3 may form a thin film even below the undercut due to the tip TIP of the bank structure BNS.

The first inorganic layer TL1 may be disposed on the first light emitting element ED1 and the first electrode pattern CEP1. The first inorganic layer TL1 may be disposed along the first light emitting element ED1 and the inner sidewall of the first opening OPE1 to cover the first light emitting element ED1 and the inner sidewall of the first opening OPE1, and may be disposed to cover the first organic pattern ELP1, the first electrode pattern CEP1 and the capping pattern CLP. However, the first inorganic layer TL1 may be disposed only on the first opening OPE1 and the bank structure BNS near the first opening OPE1 without overlapping the second opening OPE2 and the third opening OPE3.

The second inorganic layer TL2 may be disposed on the second light emitting element ED2 and the first electrode pattern CEP2. The second inorganic layer TL2 may be disposed along the second light emitting element ED2 and the inner sidewall of the second opening OPE2 to cover the second light emitting element ED2 and the inner sidewall of the second opening OPE2, and may be disposed to cover the second organic pattern ELP2, the second electrode pattern CEP2 and the capping pattern CLP. However, the second inorganic layer TL2 may be disposed only on the second opening OPE2 and the bank structure BNS near the second opening OPE2 without overlapping the first opening OPE1 and the third opening OPE3.

The third inorganic layer TL3 may be disposed on the third light emitting element ED3 and the third electrode pattern CEP3. The third inorganic layer TL3 may be disposed along the third light emitting element ED3 and the inner sidewall of the third opening OPE3 to cover the third light emitting element ED3 and the inner sidewall of the third opening OPE3, and may be disposed to cover the third organic pattern ELP3, the third electrode pattern CEP3 and the capping pattern CLP. However, the third inorganic layer TL3 may be disposed only on the third opening OPE3 and the bank structure BNS near the third opening OPE3 without overlapping the first opening OPE1 and the second opening OPE2.

The first inorganic layer TL1 may be formed after the first common electrode CE1 is formed, the second inorganic layer TL2 may be formed after the second common electrode CE2 is formed, and the third inorganic layer TL3 may be formed after the third common electrode CE3 is formed. Therefore, the first to third inorganic layers TL1, TL2 and TL3 may be disposed to cover the different electrode patterns CEP1, CEP2 and CEP3 and the organic patterns ELP1, ELP2 and ELP3, respectively. On the plan view, each of the first inorganic layer TL1, the second inorganic layer TL2 and the third inorganic layer TL3 may have an area greater than that of each of the openings OPE1, OPE2 and OPE3 of the bank structure BNS. The first inorganic layer TL1, the second inorganic layer TL2 and the third inorganic layer TL3 may be spaced apart from one another on the bank structure BNS. Therefore, a portion of the third bank layer BN3 of the bank structure BNS may not overlap the inorganic layers TL1, TL2 and TL3, and a portion of the upper surface thereof may be exposed without being covered by the inorganic layers TL1, TL2 and TL3. A portion of the third bank layer BNL3 may be directly in contact with the second encapsulation layer TFE2 of the thin film encapsulation layer TFEL, which will be described later.

The light shielding layer BM may be disposed on the thin film encapsulation layer TFEL. The light shielding layer BM may be provided a plurality of holes OPT1, OPT2, OPT3 disposed to overlap the light emission areas EA1, EA2 and EA3. In an embodiment, for example, the first hole OPT1 may be disposed to overlap the first light emission area EA1. In such an embodiment, the second hole OPT2 may be disposed to overlap the second light emission area EA2, and the third hole OPT3 may be disposed to overlap the third light emission area EA3. An area or size of each of the holes OPT1, OPT2, OPT3 may be greater than that of the light emission areas EA1, EA2 and EA3 defined by the bank structure BNS. As the holes OPT1, OPT2 and OPT3 of the light shielding layer BM are formed to be greater than the light emission areas EA1, EA2 and EA3, light emitted from the light emission areas EA1, EA2 and EA3 may be visible to a user from the side as well as the front surface of the display device 10.

The light shielding layer BM may include a light absorbing material. In an embodiment, for example, the light shielding layer BM may include an inorganic black pigment or an organic black pigment. The inorganic black pigment may be carbon black, and the organic black pigment may include, but is not limited to, at least one selected from lactam black, perylene black and aniline black. The light shielding layer BM may prevent visible light from being permeated among the first to third light emission areas EA1, EA2 and EA3, thereby preventing a color mixture from occurring to improve a color reproduction rate of the display device 10.

The display device 10 may include a plurality of color filters CF1, CF2 and CF3 disposed on the light emission areas EA1, EA2 and EA3. The plurality of color filters CF1, CF2 and CF3 may be disposed to respectively correspond to the light emission areas EA1, EA2 and EA3. In an embodiment, for example, the color filters CF1, CF2 and CF3 may be disposed on the light shielding layer BM that includes a plurality of holes OPT1, OPT2 and OPT3 disposed to correspond to the light emission areas EA1, EA2 and EA3. The holes of the light shielding layer may be formed to overlap the light emission areas EA1, EA2 and EA3 or the openings of the bank structures BNS, and may form light output areas to which light emitted from the light emission areas EA1, EA2 and EA3 is output. Each of the color filters CF1, CF2 and CF3 may have an area greater than that of the hole of the light shielding layer BM, and each of the color filters CF1, CF2 and CF3 may completely cover the light output area defined by the hole.

The color filters CF1, CF2 and CF3 may include a first color filter CF1, a second color filter CF2 and a third color filter CF3, which are respectively disposed to correspond to the different emission areas EA1, EA2 and EA3. The color filters CF1, CF2 and CF3 may include a colorant, such as a dye or a pigment, which absorbs light of a wavelength range other than light of a specific wavelength range, and may be disposed to correspond to a color of light emitted from each of the light emission areas EA1, EA2 and EA3. In an embodiment, for example, the first color filter CF1 may be a red color filter disposed to overlap the first light emission area EA1, and which transmits only the first light of a red color. The second color filter CF2 may be a green color filter disposed to overlap the second light emission area EA2, and which transmits only the second light of a green color. The third color filter CF3 may be a blue color filter disposed to overlap the third light emission area EA3, and which transmits only the third light of a blue color.

The plurality of color filters CF1, CF2 and CF3 may be spaced apart from one another on the light shielding layer BM. The color filters CF1, CF2 and CF3 may respectively cover the holes OPT1, OPT2 and OPT3 of the light shielding layer BM, and may have an area that is greater than that of the hole and spaced apart from the other color filters on the light shielding layer BM but is not limited thereto. The color filters CF1, CF2 and CF3 may be disposed to partially overlap other adjacent color filters CF1, CF2 and CF3. The different color filters CF1, CF2 and CF3 do not overlap the light emission areas EA1, EA2 and EA3, and may overlap one another on the light shielding layer BM that will be described later. The display device 10 may reduce intensity of reflective light due to external light as the color filters CF1, CF2 and CF3 are disposed to overlap one another. Furthermore, a color sense of the reflective light due to the external light may be controlled by adjusting layouts, shapes, areas of the color filters CF1, CF2 and CF3 on the plan view.

The color filters CF1, CF2 and CF3 of the color filter layer CFL may be disposed on the light shielding layer BM. The different color filters CF1, CF2 and CF3 may be disposed to correspond to the different light emission areas EA1, EA2 and EA3 or the openings OPE1, OPE2 and OPE3 and the holes OPT1, OPT2 and OPT3 of the light shielding layer BM, respectively. In an embodiment, for example, the first color filter CF1 may be disposed to correspond to the first light emission area EA1, the second color filter CF2 may be disposed to correspond to the second light emission area EA2, and the third color filter CF3 may be disposed to correspond to the third light emission area EA3. The first color filter CF1 may be disposed in the first hole OPT1 of the light shielding layer BM, the second color filter CF2 may be disposed in the second hole OPT2 of the light shielding layer BM, and the third color filter CF3 may be disposed in the third hole OPT3 of the light shielding layer BM. Each of the color filters CF1, CF2 and CF3 may be disposed to have an area greater than that of each of the holes OPT1, OPT2 and OPT3 of the light shielding layer BM on the plan view, and a portion of each of the color filters CF1, CF2 and CF3 may be disposed directly on the light shielding layer BM.

An overcoat layer OC may be disposed on the color filters CF1, CF2 and CF3 to planarize upper ends of the color filters CF1, CF2 and CF3. The overcoat layer OC may be a colorless light-transmissive layer that does not have a color of a visible light band. In an embodiment, for example, the overcoat layer OC may include a colorless light-transmissive organic material such as an acrylic resin.

Hereinafter, a fabricating process of the display device 10 according to an embodiment of the disclosure will be described with reference to the other drawings.

FIGS. 7 to 14 are cross-sectional views illustrating a fabricating process of a display device according to an embodiment. FIGS. 7 to 14 schematically illustrate a process of forming a bank structure BNS as a light emitting element layer EML of the display device 10, light emitting elements ED and a thin film encapsulation layer TFEL. Hereinafter, a detailed process of forming each layer with respect to a fabricating process of the display device 10 will be omitted, and a formation order of each layer will be described.

Figure 7:
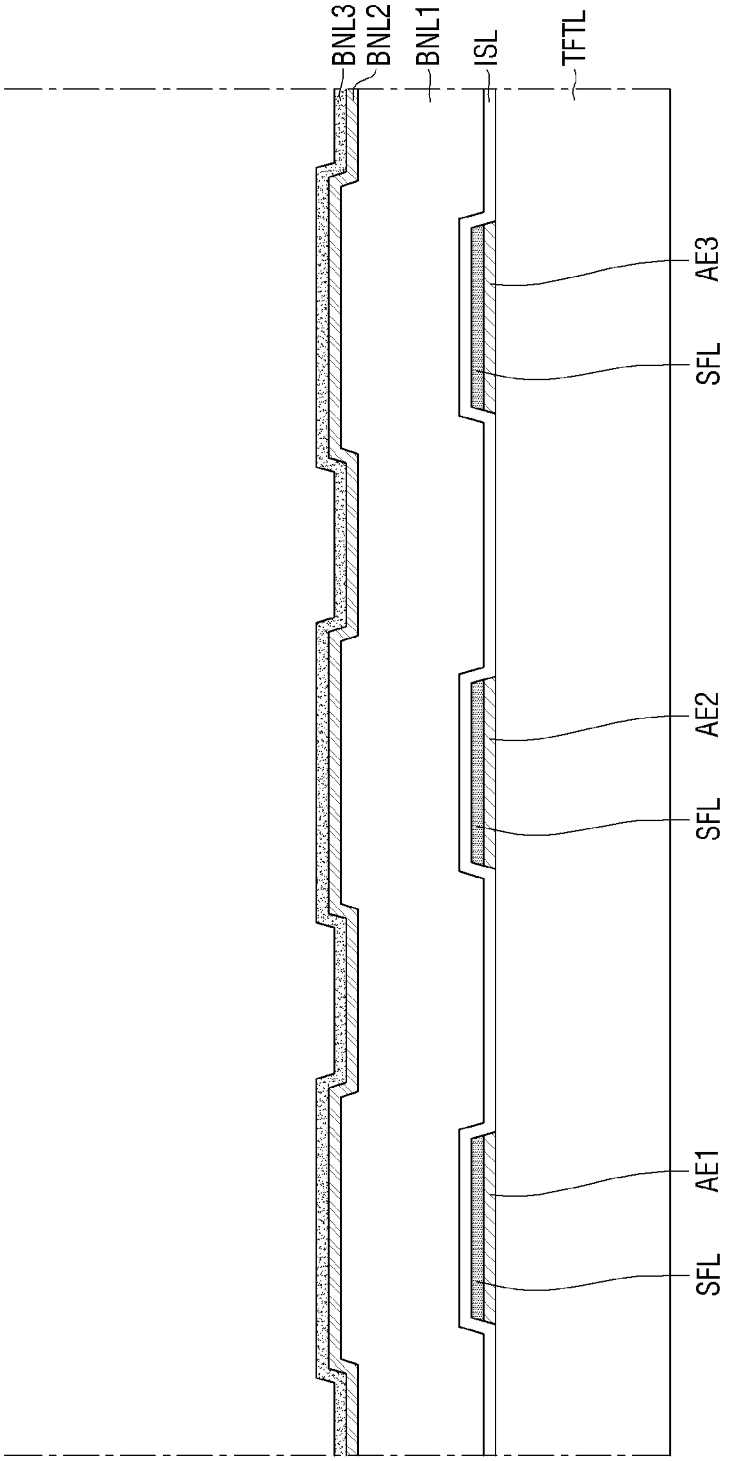
FIGS. 7 to 14 are cross-sectional views illustrating a fabricating process of a display device according to an embodiment.

Referring to FIG. 7, a plurality of pixel electrodes AE1, AE2 and AE3, a sacrificial layer SFL, an inorganic insulating layer ISL and a plurality of bank material layers BNL1, BNL2 and BNL3 are formed on a thin film transistor layer TFTL.

Although not shown, the thin film transistor layer TFTL may be disposed on a substrate SUB, and a structure of the thin film transistor layer TFTL is the same as that described above with reference to FIG. 5. Any repetitive detailed description of the thin film transistor layer TFTL will be omitted.

The plurality of pixel electrodes AE1, AE2 and AE3 may be disposed to be spaced apart from one another on the thin film transistor layer TFTL. The pixel electrodes AE1, AE2 and AE3 may include a first pixel electrode AE1, a second pixel electrode AE2 and a third pixel electrode AE3 of different light emitting elements ED1, ED2 and ED3. The first to third pixel electrodes AE1, AE2 and AE3 may be spaced apart from one another on the thin film transistor layer TFTL.

The sacrificial layer SFL may be disposed on the pixel electrodes AE1, AE2 and AE3. The sacrificial layer SFL may be disposed on the pixel electrodes AE1, AE2 and AE3 and then a portion of the sacrificial layer SFL may be removed in a subsequent process to form a space in which light emitting layers EL1, EL2 and EL3 are disposed. The sacrificial layer SFL may prevent upper surfaces of the pixel electrode AE1, AE2 and AE3 from being in contact with an inorganic insulating layer ISL. Also, the sacrificial layer SFL may be removed to form a space between the pixel electrode AE1, AE2 and AE3 and the inorganic insulating layer ISL. In an embodiment, the sacrificial layer SFL may include an oxide semiconductor. The sacrificial layer SFL may include at least one selected from IGZO, zinc tin oxide (ZTO) and IZO.

The inorganic insulating layer ISL and bank material layers BNL1, BNL2 and BNL3 may be disposed on the thin film transistor layer TFTL to cover the sacrificial layer SFL. The inorganic insulating layer ISL may be disposed to entirely cover the sacrificial layer SFL and the thin film transistor layer TFTL, and the plurality of bank material layers BNL1, BNL2 and BNL3 may be disposed to entirely cover the inorganic insulating layer ISL. The bank material layers BNL1, BNL2 and BNL3 may include a first bank material layer BNL1, a second bank material layer BNL2 and a third bank material layer BNL3, which are sequentially stacked. The first bank material layer BNL1 may be directly disposed on the inorganic insulating layer ISL, and the second bank material layer BNL2 and the third bank material layer BNL3 may be sequentially disposed on the first bank material layer BNL1. The bank material layers BNL1, BNL2 and BNL3 may be partially etched in a subsequent process to respectively form bank layers BN1, BN2 and BN3 of the bank structures BNS illustrated in FIG. 5. The first bank material layer BNL1 and the second bank material layer BNL2 may include metal materials different from each other to form a first bank layer BN1 and a second bank layer BN2, and the third bank material layer BNL3 may include an oxide semiconductor to form a third bank layer BN3.

Figure 8:
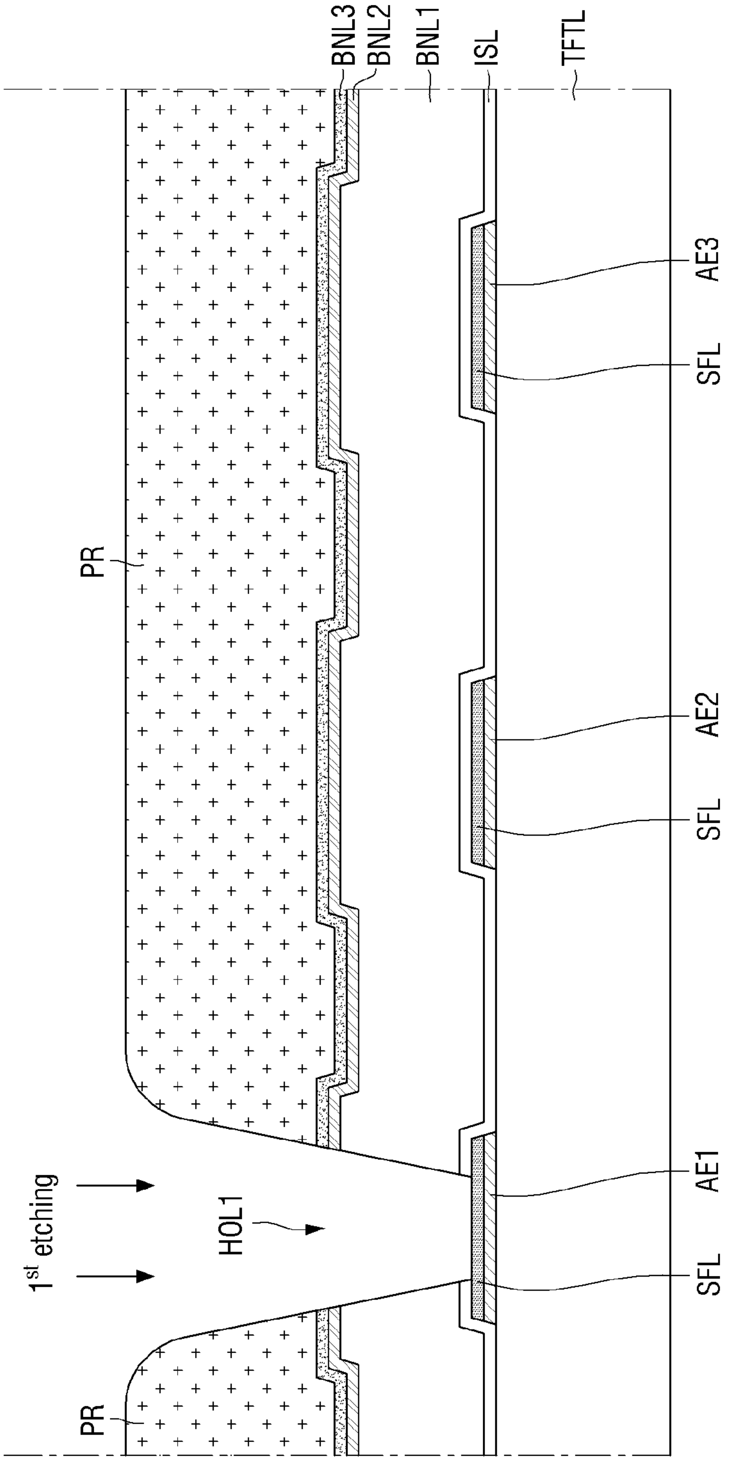

Next, referring to FIG. 8, a photoresist PR is formed on the bank material layers BNL1, BNL2 and BNL3, and a first etching process is performed to etch a portion of the bank material layers BNL1, BNL2 and BNL3 using the photoresist PR as a mask to form a first hole HOL1.

The photoresist PR may be disposed to be spaced apart from another photoresist PR on bank material layers BNL1, BNL2 and BNL3. The photoresists PR may be disposed to expose a portion overlapping the first pixel electrode AE1 on the third bank material layer BNL3.

In an embodiment, the first etching process may be performed by dry etching. As the first etching process is performed by dry etching, the bank material layers BNL1, BNL2 and BNL3 including different materials may be anisotropically etched. In this process, the bank material layers BNL1, BNL2, and BNL3 and a portion of the inorganic insulating layer ISL may be etched together to partially expose the sacrificial layer SFL therebelow. The first hole HOL1 may be formed in an area overlapping the pixel electrodes AE1, AE2 and AE3, and may form openings OPE1, OPE2 and OPE3 of the bank structure BNS.

Figure 9:
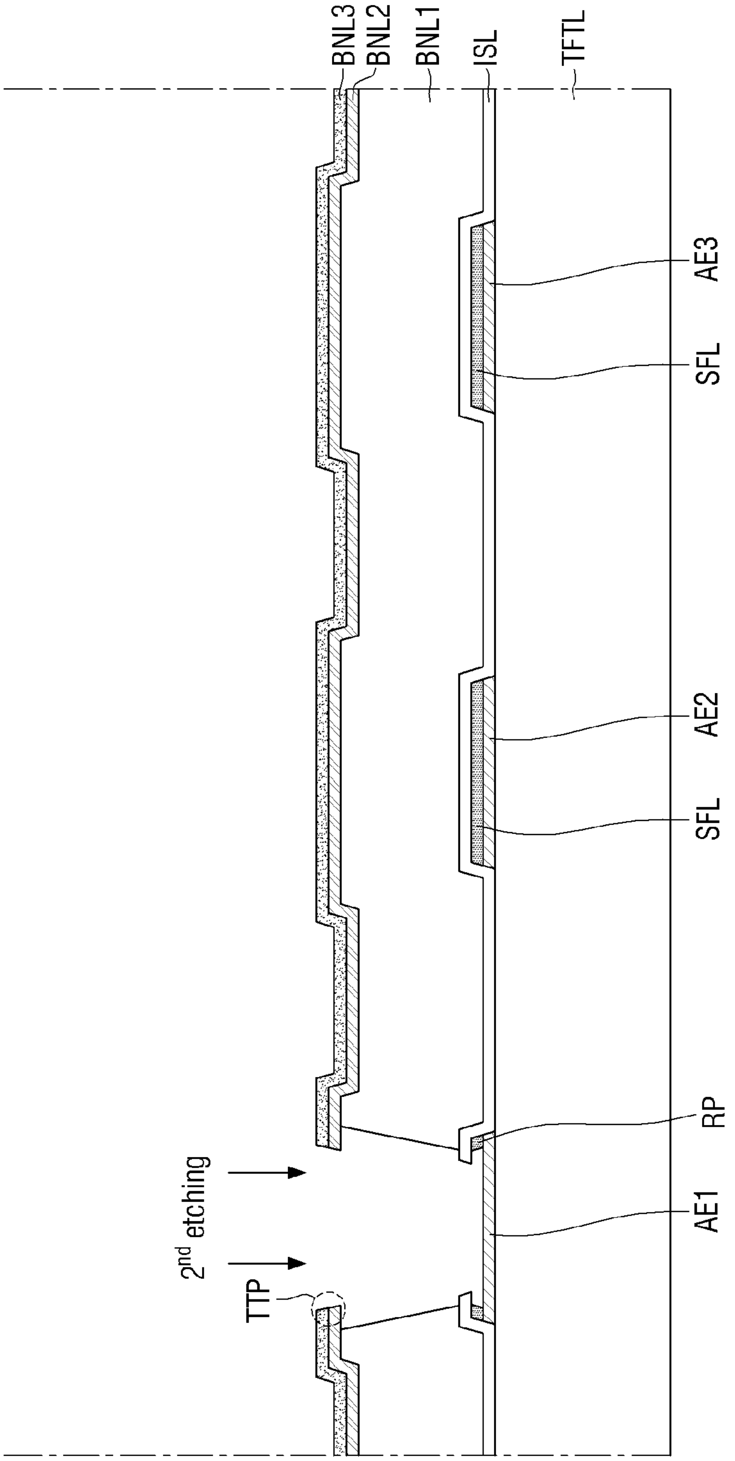

Then, referring to FIG. 9, a second etching process is performed to remove the sacrificial layer SFL disposed on the first pixel electrode AE1. In an embodiment, the sacrificial layer SFL may include an oxide semiconductor layer, and the second etching process may be performed by wet etching. In this process, while the sacrificial layer SFL is being removed, the bank material layers BNL1, BNL2 and BNL3 may be isotropically etched in the first hole HOL1. The first bank material layer BNL1 among the plurality of bank material layers BNL1, BNL2 and BNL3 may have an etch rate faster than the other bank material layers, and the second bank material layer BNL2 and the third bank material layer BNL3 may form a tip TIP more protruded than a side surface of the first bank material layer BNL1. On the side surface of the first bank material layer BNL1, an undercut may be formed below the tip TIP of the second bank material layer BNL2 and the third bank material layer BNL3. In accordance with the second etching process, the first hole HOL1 may form the first opening OPE1 or the first light emission area EA1.

A portion of the sacrificial layer SFL, which is exposed by the first hole HOL1, and a portion between the inorganic insulating layer ISL and the first pixel electrode AE1 may be removed. However, the sacrificial layer SFL may not be completely removed, and may partially remain as a residual pattern RP between the inorganic insulating layer ISL and the first pixel electrode AE1. A space may be formed between the first pixel electrode AE1 and the inorganic insulating layer ISL disposed on the first pixel electrode AE1 as a portion remaining after the sacrificial layer SFL is removed. In a subsequent process, the first light emitting layer EL1 disposed on the first pixel electrode AE1 may be formed to fill the space.

Figure 10:
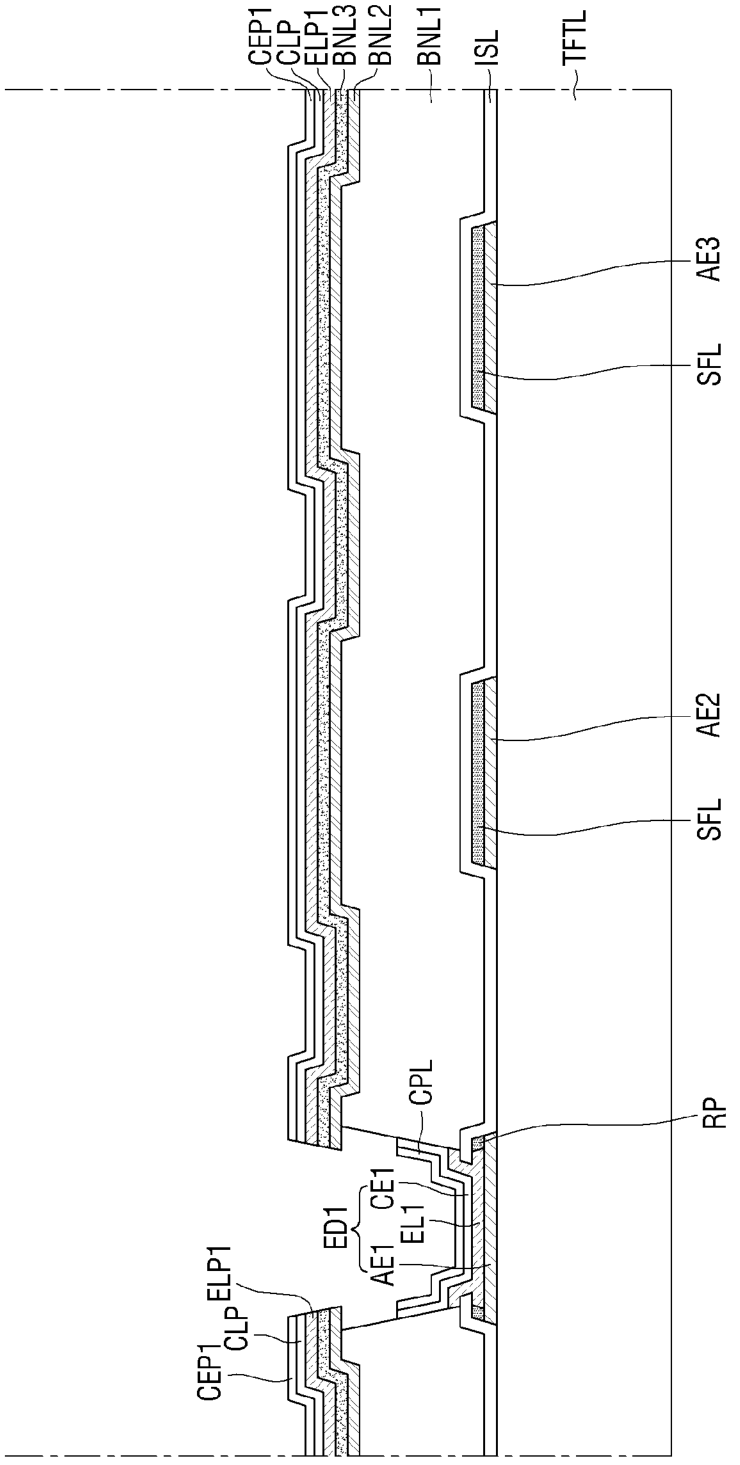

Next, referring to FIG. 10, the first light emitting layer EL1, the first common electrode CE1 and the capping layer CPL are deposited on the first pixel electrode AE1, and the first light emitting element ED1 is formed. The first light emitting layer EL1 and the first common electrode CE1 are formed in the first opening OPE1, and materials forming the first light emitting layer EL1 and the first common electrode CE1 in the deposition process are also deposited on the third bank material layer BNL3 to form a plurality of patterns. In an embodiment, for example, some of the materials may be deposited on the third bank material layer BNL3 to form a first organic pattern ELP1 and a first electrode pattern CEP1. A portion of the capping layer CPL may be disposed in the first opening OPE1 to cover the first light emitting element ED1, and another portion of the capping layer CPL may be disposed on the third bank material layer BNL3 to cover the first organic pattern ELP1 and the first electrode pattern CEP1. The structure of the first light emitting layer EL1, the first common electrode CE1, the first organic pattern ELP1 and the first electrode pattern CEP1 is the same as that described above.

In an embodiment, the first light emitting layer EL1 and the first common electrode CE1 may be formed through a deposition process. The materials of the first opening OPE1 and the trench TP may not be actively deposited due to the tip TIP of the second bank material layer BNL2 and the third bank material layer BNL3. However, since the materials of the first light emitting layer EL1 and the first common electrode CE1 are deposited in an inclined direction that is not perpendicular to the upper surface of the substrate, deposition may be performed even in an area covered by the tip TIP of the second bank material layer BNL2 and the third bank material layer BNL3.

In an embodiment, for example, the deposition process for forming the first light emitting layer EL1 may be performed in a way such that the materials are deposited in a direction that is not perpendicular to the upper surface of the first pixel electrode AE1, for example, in a direction inclined at a first angle. In an embodiment, the deposition of the material in the process of forming the light emitting layers EL1, EL2 and EL3 may be performed by being inclined at an angle in a range of about 450 to about 500 from the upper surfaces of the pixel electrodes AE1, AE2 and AE3. The first light emitting layer EL1 may be formed to fill the space between the first pixel electrode AE1 and the inorganic insulating layer ISL, and may be also formed in the area covered by the tip of the second bank material layer BNL2 and the third bank material layer BNL3. In an embodiment, for example, the first light emitting layer EL1 is an area covered by the tip TIP, and may be partially disposed on the side surface of the first bank material layer BNL1.

The deposition process of forming the first common electrode CE1 may be performed in a way such that the materials are deposited in a direction that is not perpendicular to the upper surface of the first pixel electrode AE1, for example, in a direction inclined at a second angle. In an embodiment, the deposition of the material in the process of forming the common electrodes CE1, CE2 and CE3 may be performed by being inclined at an angle of about 30° or less from the upper surfaces of the pixel electrodes AE1, AE2 and AE3. The first common electrode CE1 may be disposed on the first light emitting layer EL1, and may be also formed in the area covered by the tip TIP of the second bank material layer BNL2 and the third bank material layer BNL3. In an embodiment, for example, the first common electrode CE1 is an area covered by the tip TIP, and may be partially disposed on the side surface of the first bank material layer BNL1.

The deposition process of forming the common electrodes CE1, CE2 and CE3 may be performed by being inclined to be relatively closer to a horizontal direction than the deposition process of forming the light emitting layers EL1, EL2 and EL3. Therefore, the common electrodes CE1, CE2 and CE3 may have a contact area with the first bank material layer BNL1 or the side surface of the first bank layer BN1, which is greater than that of the light emitting layers EL1, EL2 and EL3. Alternatively, the common electrodes CE1, CE2 and CE3 may be deposited to reach a higher position from the first bank material layer BNL1 or the side surface of the first bank layer BN1 than the light emitting layers EL1, EL2 and EL3. The different common electrodes CE1, CE2 and CE3 may be electrically connected to one another in contact with the first bank layer BN1 formed by the first bank material layer BNL1 having high conductivity.

Figure 11:
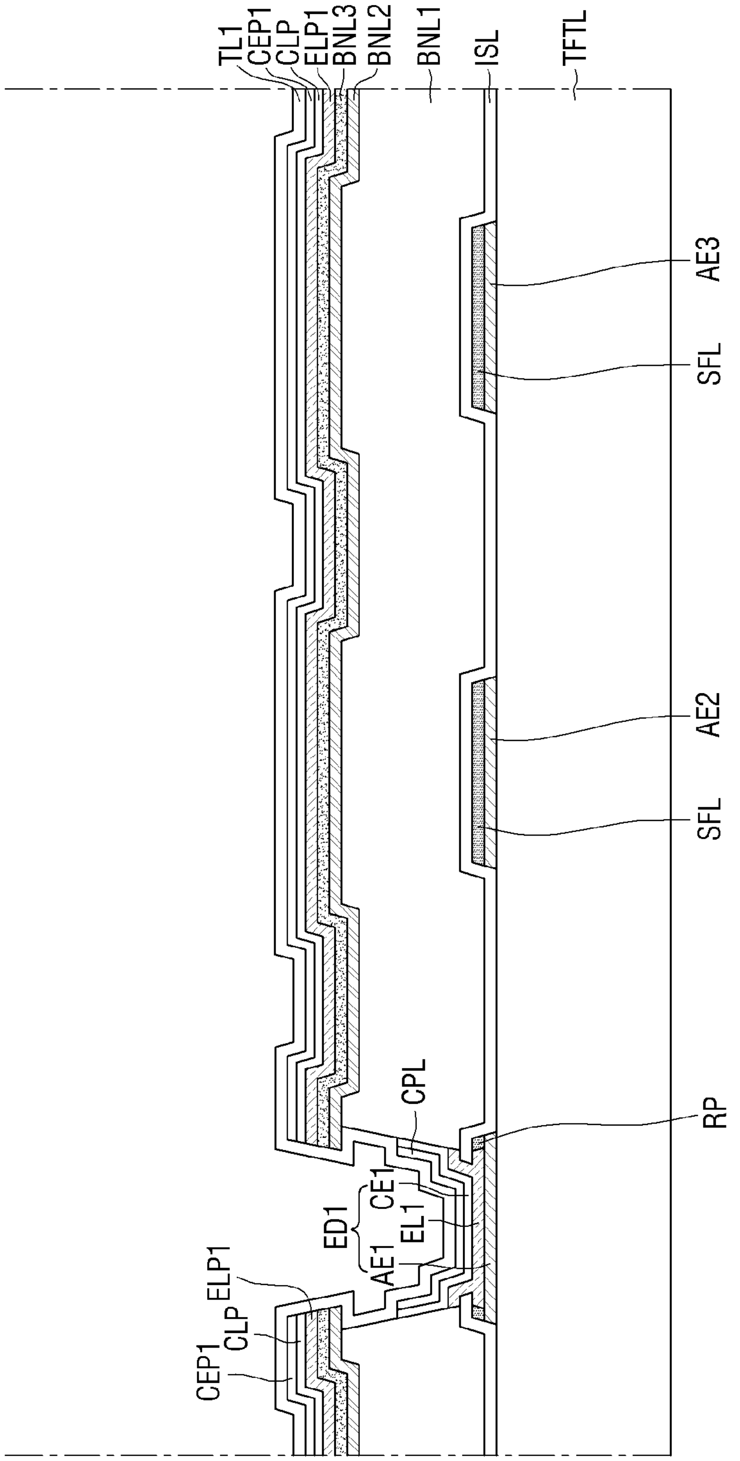

Next, referring to FIG. 11, the first inorganic layer TL1 covering the first light emitting element ED1 and the capping layer CPL is formed. The first inorganic layer TL1 may be formed by a chemical vapor deposition (CVD) process unlike the light emitting layers EL1, EL2 and EL3 and the common electrodes CE1, CE2 and CE3. The first inorganic layer TL1 may form a uniform film (i.e., a film having a constant thickness) regardless of a step difference of a portion that is deposited. The first inorganic layer TL1 may be formed to completely cover the first light emitting element ED1 and outer surfaces of the bank material layers BNL1, BNL2 and BNL3 and the capping layer CPL. In an embodiment, the first inorganic layer TL1 may be also deposited below the tip TIP of the second bank material layer BNL2 and the third bank material layer BNL3.

Figure 12:
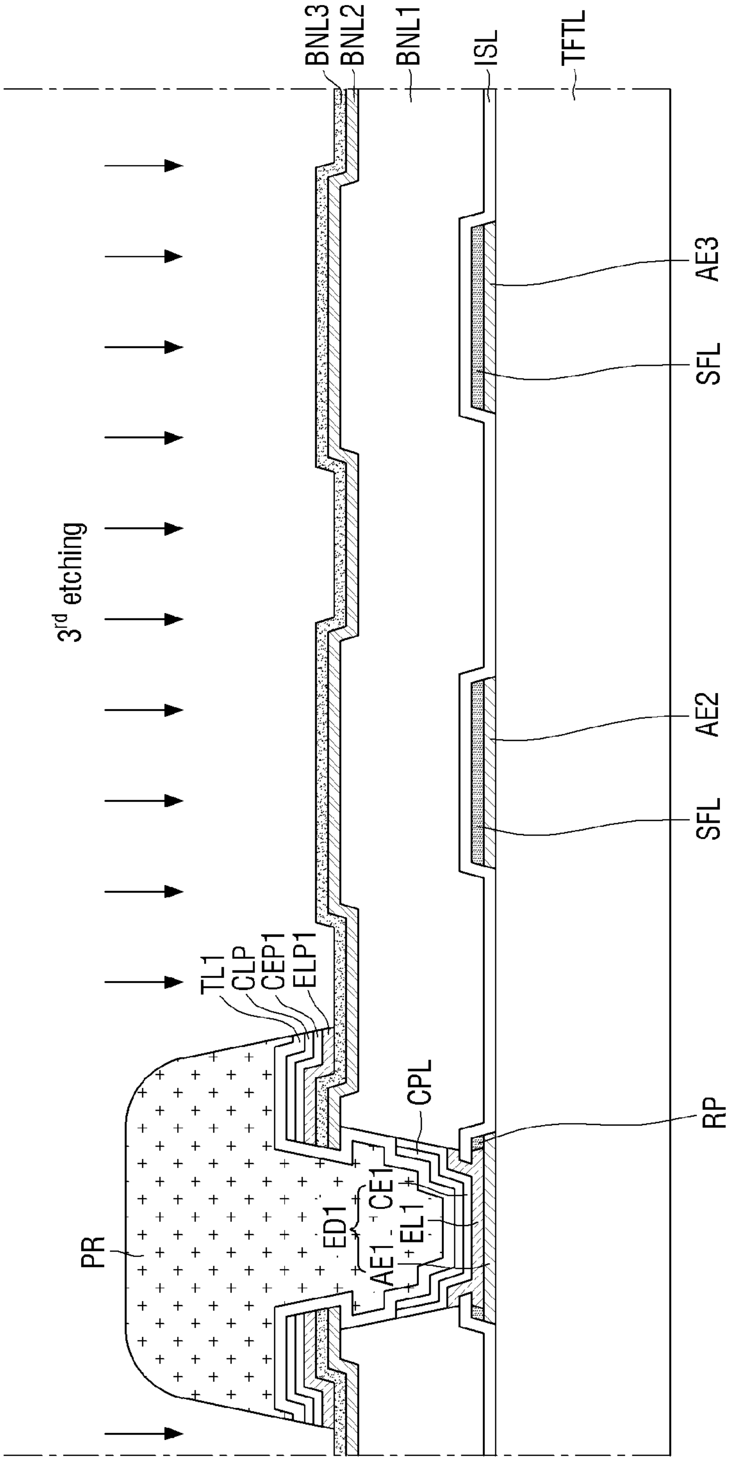

Next, referring to FIG. 12, the photoresist PR is formed on the first inorganic layer TL1, and a third etching process is performed to remove a portion of the first organic pattern ELP1, the first electrode pattern CEP1, the capping layer CPL and the first inorganic layer TL1, which are disposed on the bank material layers BNL1, BNL2 and BNL3.

In this process, the photoresist PR may be disposed to overlap the first opening OPE1 or the first light emitting element ED1. The first organic pattern ELP, the first electrode pattern CEP1, the capping pattern CLP and the first inorganic layer TL1, which are disposed on the bank material layers BNL1, BNL2 and BNL3, may be all removed except the first opening OPE1 or the periphery of the first light emitting element ED1. In this process, the area except the first opening OPE1 of the third bank material layer BNL3 or the periphery of the first light emitting element ED1 may be exposed.

According to an embodiment, the third etching process for removing the first inorganic layer TL1 disposed on the bank material layers BNL1, BNL2 and BNL3 may be performed by dry etching through a fluorine (F)-based etchant. An etchant for not etching the third bank material layer BNL3 or the third bank layer BN3, which includes an oxide semiconductor, while removing at least the first inorganic layer TL1 may be used for the third etching process. The fluorine-based etchant may etch the first inorganic layer TL1 including silicon, but mat not etch the third bank layer BNL3 or the third bank layer BN3, which includes an oxide semiconductor. In the third etching process performed using a fluorine-based etchant, the third bank material layer BNL3 is not etched by the etchant, whereby the second bank material layer BNL2 may be prevented from being damaged by the etchant. Therefore, a thickness of the second bank material layer BNL2 may be maintained even after the third etching process is performed.

Figure 13:
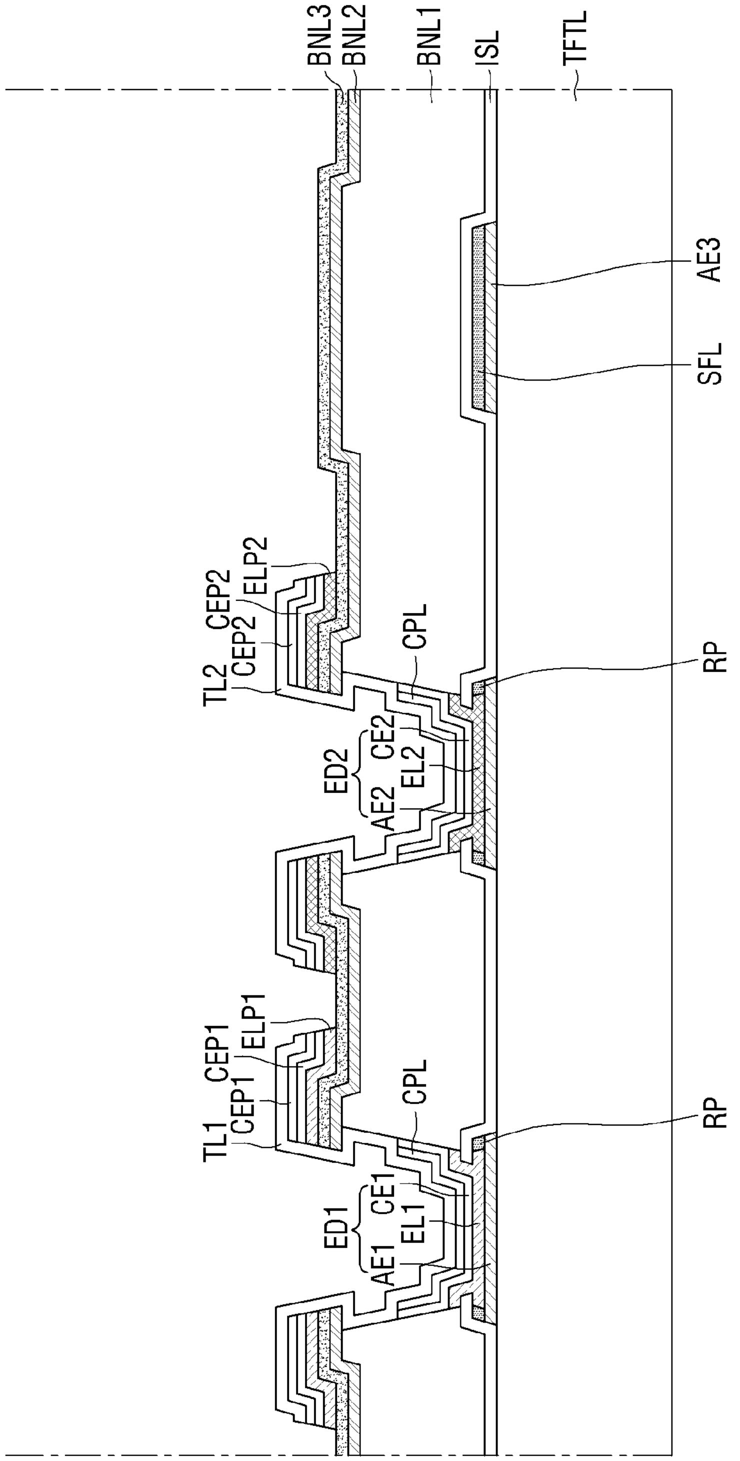
Figure 14:
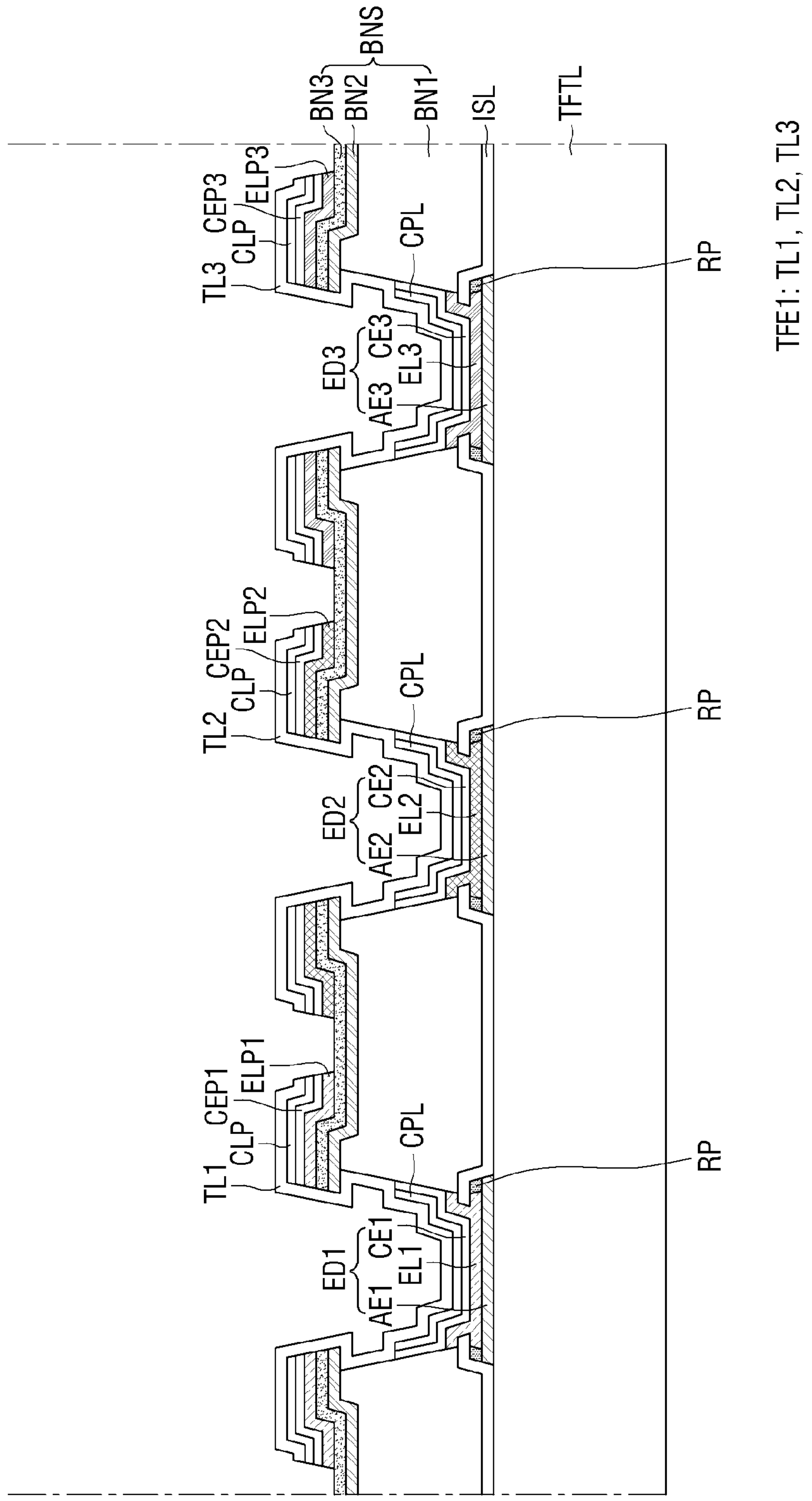

The first light emitting element ED1 and the first inorganic layer TL1 covering the first light emitting element EDT, the first organic pattern ELP1, the first electrode pattern CEP1 and the capping layer CPL may be formed through the above processes. Referring to FIGS. 13 and 14, processes similar to those described above may be repeated to form the second light emitting element ED2, the third light emitting element ED3, the second and third organic patterns ELP2 and ELP3, the second and third electrode patterns CEP2 and CEP3, the second inorganic layer TL2 and the third inorganic layer TL3.

After the first light emitting element ED1 is formed, the third etching process for etching the inorganic layers TL1, TL2 and TL3 may be repeated in the process of forming the second light emitting element ED2 and the third light emitting element ED3. The second bank material layer BNL2 may be protected by the third bank material layer BNL3 even in the repeated third etching process to maintain its thickness. Therefore, even though the repeated etching process is performed, the tip TIP of each of the second bank layer BN2 and the third bank layer BN3, which is formed on the inner sidewall of each of the openings OPE1, OPE2 and OPE3, may maintain its shape and thickness throughout the bank structure BNS. The display device 10 may include the tips TIP uniformly formed in the bank structure BNS to effectively maintain a contact area between the common electrodes CE1, CE2 and CE3 of the light emitting elements ED1, ED2 and ED3 and the first bank layer BN1 in each of the light emission areas EAT, EA2 and EA3 and substantially reduce a luminance difference among the light emitting elements ED1, ED2 and ED3.

Subsequently, although not shown, the display device 10 is fabricated by forming the light emitting elements ED1, ED2 and ED2 and forming a second encapsulation layer TFE2 and a third encapsulation layer TFE3 of the thin film encapsulation layer TFEL, a light shielding layer BM, a color filter layer CFL and an overcoat layer OC on the bank structure BNS. The structure of the thin film encapsulation layer TFEL, the light shielding layer BM, the color filter layer CFL and the overcoat layer OC is the same as that described above and thus any repetitive detailed description thereof will be omitted.

Figure 15:
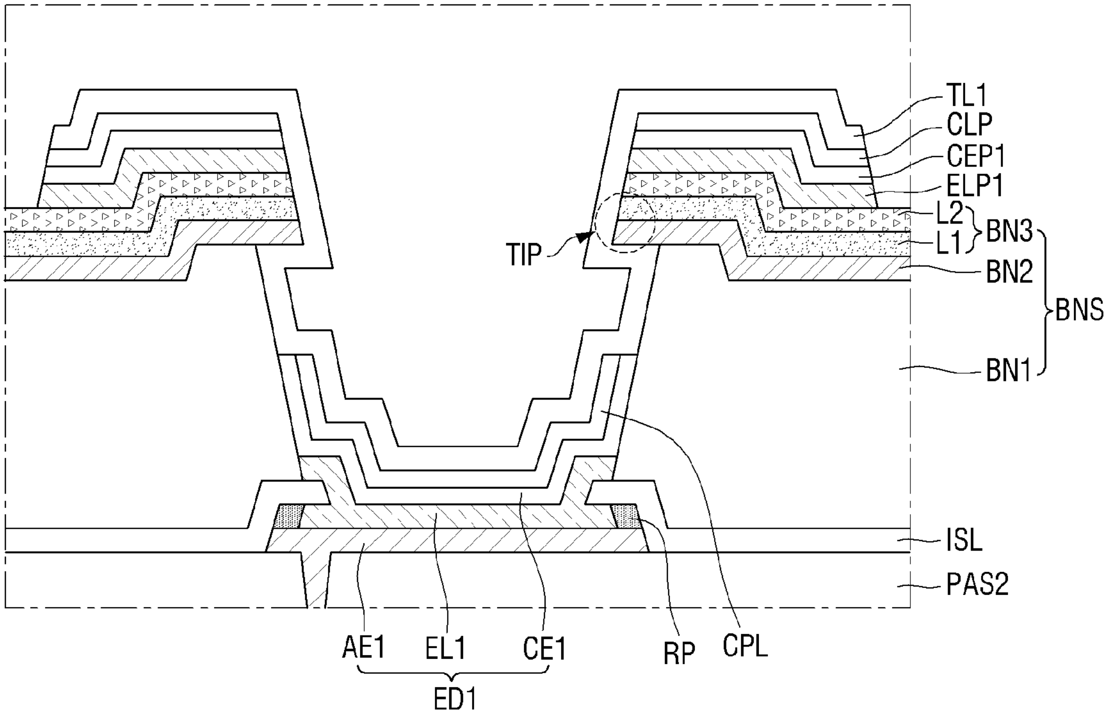
FIG. 15 is a cross-sectional view illustrating a portion of a display device according to an alternative embodiment.

FIG. 15 is a cross-sectional view illustrating a portion of a display device according to an alternative embodiment.

Referring to FIG. 15, in the display device 10 according to an embodiment, the third bank layer BN3 of the bank structure BNS may have a structure in which oxide semiconductor layers of at least one or more layers L1 and L2 are stacked. In an embodiment, for example, the third bank layer BN3 may include a first oxide semiconductor layer L1 and a second oxide semiconductor layer L2, each of which includes an oxide semiconductor. As described above, each of the first oxide semiconductor layer L1 and the second oxide semiconductor layer L2 includes at least one selected from IZO, IGZO, ITGZO, ITO, ITZO, ITGO and IGO, and may include different oxide semiconductors from each other. The third bank layer BN3 may have a structure in which different oxide semiconductor layers are stacked. In an embodiment, as shown in FIG. 15, the third bank layer BN3 includes different oxide semiconductor layers L1 and L2 to have a double-layered structure, but is not limited thereto. Alternatively, the third bank layer BN3 may include a greater number of oxide semiconductor layers to have a stacked structure of a triple layer or a multi-layer.

In an embodiment, as shown in FIG. 15, where the third bank layer BN3 has a double-layered structure, the third bank layer BN3 may have a stacked structure of any one of IZO/IGZO, IGZO/IZO, IZO/ITGZO, ITGZO/IZO, IGZO/ITGZO and ITGZO/IGZO. In an alternative embodiment where the third bank layer BN3 has a triple-layered structure, the third bank layer BN3 may have a stack structure of any one of IZO/IGZO/ITGZO, IZO/ITGZO/IGZO, IGZO/ITGZO/IZO, IGZO/IZO/ITGZO and ITGZO/IZO/IGZO, but is not limited thereto.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a first pixel electrode and a second pixel electrode disposed on a substrate and spaced apart from each other;

an inorganic insulating layer disposed on the substrate and including a portion disposed on the first pixel electrode and a portion disposed on the second pixel electrode;

a bank structure disposed on the inorganic insulating layer, wherein a first opening overlapping the first pixel electrode and a second opening overlapping the second pixel electrode are defined through the bank structure;

a first light emitting layer disposed on the first pixel electrode, and a second light emitting layer disposed on the second pixel electrode; and a first common electrode disposed on the first light emitting layer, and a second common electrode disposed on the second light emitting layer, wherein the bank structure includes a first bank layer, a second bank layer disposed on the first bank layer and including a metal material different from a metal material of the first bank layer, and a third bank layer disposed on the second bank layer and including at least one oxide semiconductor layer, and each of the second bank layer and the third bank layer includes a tip defined on each of sidewalls of the bank structure defining the first opening and the second opening and protruding further than the first bank layer, wherein the third bank layer includes at least one selected from indium zinc oxide (IZO), indium gallium zinc oxide (IGZO), indium tin gallium zinc oxide (ITGZO), indium tin zinc oxide (ITZO), indium tin gallium oxide (ITGO) and indium gallium oxide (IGO).

2. The display device of claim 1, wherein the first bank layer includes aluminum (Al), and the second bank layer includes titanium (Ti).

3. The display device of claim 2, wherein the third bank layer includes a first oxide semiconductor layer, and a second oxide semiconductor layer disposed on the first oxide semiconductor layer and including an oxide semiconductor different from an oxide semiconductor of the first oxide semiconductor layer.

4. The display device of claim 1, wherein the third bank layer has a thickness in a range of about 100 Å to about 1500 Å.

5. The display device of claim 1, wherein the tip defined on a sidewall of the bank structure defining the first opening has a thickness the same as a thickness of the tip defined on a sidewall of the bank structure defining the second opening.

6. The display device of claim 1, wherein each of the first common electrode and the second common electrode is directly in contact with a side surface of the first bank layer.

7. The display device of claim 1, further comprising:

a first organic pattern disposed on the third bank layer to surround the first opening and including a same material as a material of the first light emitting layer;

a first electrode pattern disposed on the first organic pattern and including a same material as a material of the first common electrode;

a second organic pattern disposed on the third bank layer to surround the second opening and including a same material as a material of the second light emitting layer; and a second electrode pattern disposed on the second organic pattern and including a same material as that of a material second common electrode.

8. The display device of claim 7, further comprising:

a first inorganic layer disposed on a sidewall of the bank structure defining the first opening and disposed on the first common electrode and the first electrode pattern; and a second inorganic layer disposed on a sidewall of the bank structure defining the second opening and disposed on the second common electrode and the second electrode pattern, wherein the first inorganic layer and the second inorganic layer are disposed to be spaced apart from each other, and the third bank layer includes a portion not overlapping the first inorganic layer and the second inorganic layer.

9. The display device of claim 1, wherein the inorganic insulating layer is not in contact with each of upper surfaces of the first pixel electrode and the second pixel electrode, the first light emitting layer includes a portion disposed between the first pixel electrode and the inorganic insulating layer, and the second light emitting layer includes a portion disposed between the second pixel electrode and the inorganic insulating layer.

10. The display device of claim 9, further comprising:

a residual pattern disposed between the first and second pixel electrodes and the inorganic insulating layer.

11. The display device of claim 1, further comprising:

a third pixel electrode disposed to be spaced apart from the second pixel electrode on the substrate;

a third light emitting layer disposed on the third pixel electrode; and a third common electrode disposed on the third light emitting layer, wherein a third opening overlapping the third pixel electrode is defined through the bank structure.

12. The display device of claim 11, further comprising:

a third organic pattern disposed on the third bank layer to surround the third opening and including a same material as a material of the third light emitting layer;

a third electrode pattern disposed on the third organic pattern and including a same material as a material of the third common electrode; and a third inorganic layer disposed on a sidewall of the bank structure defining the third opening and disposed on the third common electrode and the third electrode pattern.

13. The display device of claim 1, further comprising:

a thin film encapsulation layer disposed on the bank structure; and, a color filter layer disposed directly on the thin film encapsulation layer, wherein the thin film encapsulation layer includes a first encapsulation layer, a second encapsulation layer disposed on the first encapsulation layer, and a third encapsulation layer disposed on the second encapsulation layer, and wherein the color filter layer is disposed directly on the third encapsulation layer.

14. The display device of claim 13, further comprising:

a light shielding layer disposed on the third encapsulation layer, wherein a plurality of opening holes is defined through the light shielding layer to overlap the first opening and the second opening, wherein the color filter layer includes a first color filter disposed on the light shielding layer and overlapping the first opening, and a second color filter overlapping the second opening.

15. The display device of claim 1, further comprising:

a color filter layer disposed over the first light emitting layer and the second light emitting layer, wherein the color filter layer includes a first color filter overlapping the third bank layer.

* * * * *